(12) United States Patent
Honda

(10) Patent No.: US 7,439,545 B2
(45) Date of Patent: Oct. 21, 2008

(54) SEMICONDUCTOR DEVICE AND ITS MANUFACTURING METHOD, AND DISPLAY DEVICE AND ELECTRONIC APPLIANCE

(75) Inventor: Tatsuya Honda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 113 days.

(21) Appl. No.: 11/636,900

(22) Filed: Dec. 11, 2006

(65) Prior Publication Data

US 2007/0138477 A1 Jun. 21, 2007

(30) Foreign Application Priority Data

Dec. 20, 2005 (JP) .............................. 2005-366023

(51) Int. Cl.
*H01L 29/04* (2006.01)
(52) U.S. Cl. .............................. 257/72; 438/151; 349/44
(58) Field of Classification Search .................. 438/30, 438/149, 151, 39; 257/59, 72, E29.275, E29.282, 257/E29.293, E29.273; 349/44
See application file for complete search history.

(56) References Cited

U.S. PATENT DOCUMENTS

| 6,882,105 | B2 * | 4/2005 | Murakami et al. | .......... 313/506 |
| 6,897,608 | B2 * | 5/2005 | Yamazaki et al. | .......... 313/506 |
| 2002/0047555 | A1 | 4/2002 | Inukai | |
| 2002/0101155 | A1 | 8/2002 | Kimura | |
| 2002/0134979 | A1 | 9/2002 | Yamazaki et al. | |
| 2003/0080436 | A1 | 5/2003 | Ishikawa | |

FOREIGN PATENT DOCUMENTS

| JP | 2002-118330 | 4/2002 |
| JP | 2004-221132 | 8/2004 |
| JP | 2005-294646 | 10/2005 |

* cited by examiner

*Primary Examiner*—David Vu
(74) *Attorney, Agent, or Firm*—Cook Alex Ltd.

(57) ABSTRACT

A semiconductor device having a light-emitting element with excellent light-emitting characteristics is provided. The semiconductor device is provided with a first depressed portion or opening portion formed in an insulating film; a first electrode which is formed over the insulating film around the first depressed portion or opening portion, which is positioned in the first depressed portion or opening portion, and which forms a second depressed portion together with the first depressed portion or opening portion; a semiconductor layer of a first conductivity type which is formed over the first electrode and which forms a third depressed portion together with the second depressed portion; a light-emitting layer which is formed over the semiconductor layer of the first conductivity type and which forms a fourth depressed portion together with the third depressed portion; a semiconductor layer of a second conductivity type which is formed over the light-emitting layer and which forms a fifth depressed portion together with the fourth depressed portion; and a second electrode formed over the semiconductor layer of the second conductivity type that forms a bottom surface and a side surface of the fifth depressed portion.

43 Claims, 16 Drawing Sheets

V>0

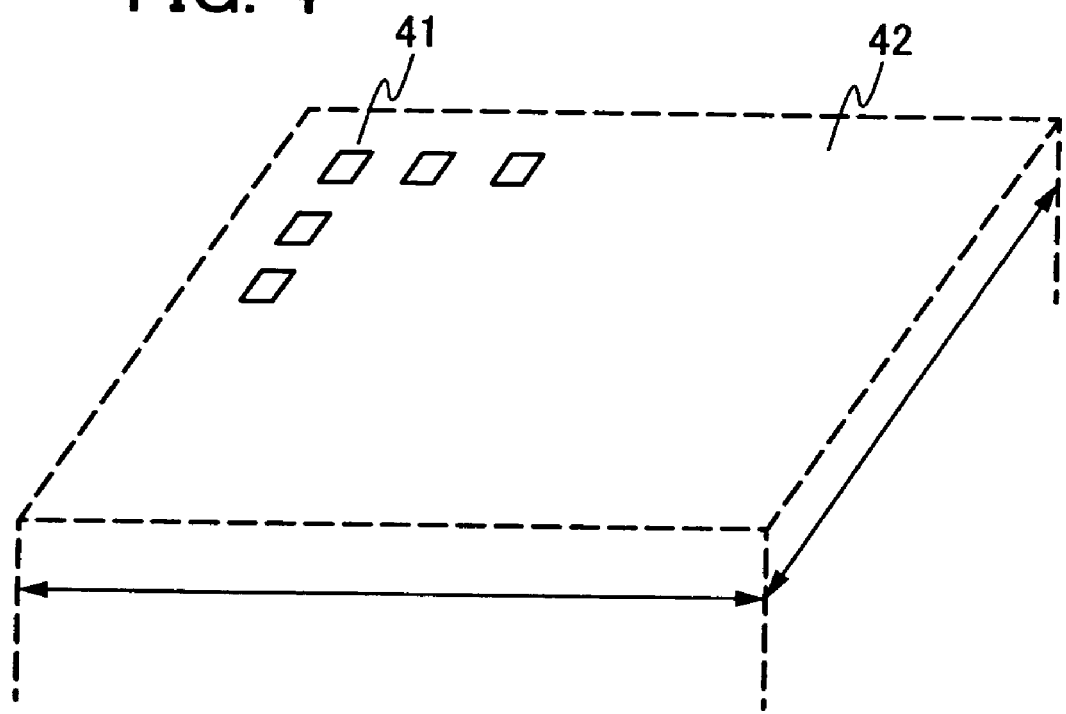

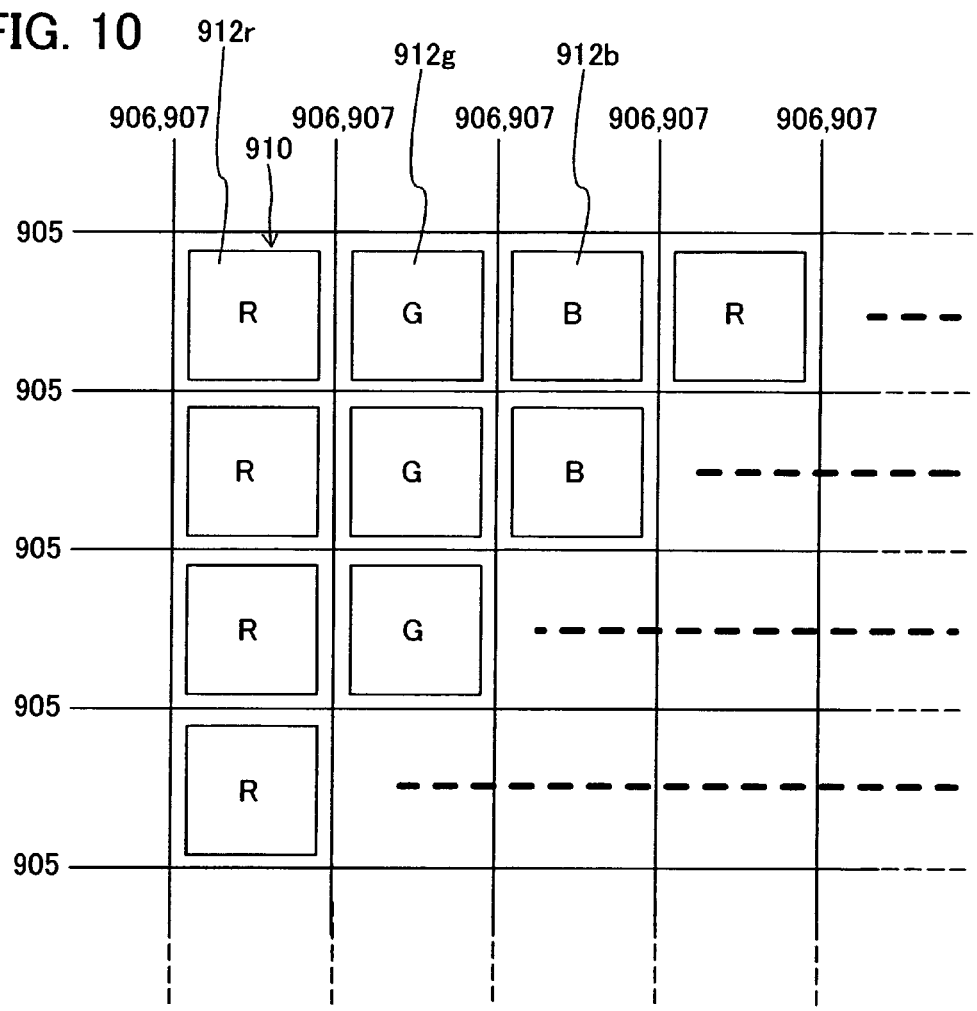

PRIOR ART

SEMICONDUCTOR DEVICE AND ITS MANUFACTURING METHOD, AND DISPLAY DEVICE AND ELECTRONIC APPLIANCE

BACKGROUND OF THE INVENTION

1. Field of the Invention

The present invention relates to a semiconductor device, a display device, and an electronic appliance each having a light-emitting element with excellent light-emitting characteristics and also relates to a manufacturing method of a semiconductor device.

2. Description of the Related Art

FIG. 16 is a drawing for explaining a structure of a conventional light-emitting element. The conventional light-emitting element has a structure in which a lower electrode 1002, a semiconductor layer 1004 of a first conductivity type, a light-emitting layer 1006, a semiconductor layer 1008 of a second conductivity type, and an upper electrode 1010 are stacked over an insulating film 1000 in this order. When a predetermined potential is given to each of the lower electrode 1002 and the upper electrode 1010, excitons are recombined in the light-emitting layer 1006 and the energy released at the recombination is emitted as light.

In a case of forming a display using a light-emitting element, light needs to be emitted from a top surface of the light-emitting element. When the upper electrode 1010 is formed by using metal, there is a method in which the upper electrode 1010 is formed to have a thickness from 5 to 200 nm so that light is emitted from the top surface. By this method, when the upper electrode 1010 formed of Ni has a thickness of 15 nm, the transmittance of ultraviolet light emitted from the light-emitting element becomes 70% or more (for example, Reference 1: Japanese Published Patent Application No. 2004-221132, 43rd paragraph and 57th paragraph).

According to the aforementioned related art, the transmittance of emitted light can be made 70% or more by decreasing the film thickness of the upper electrode (for example 15 nm). However, when the light-emitting element is used for a display, the light-transmittance of the upper electrode is desired to be 80% or more.

Moreover, as another method, a transparent electrode including ITO, ZnO, or the like may be used as the upper electrode. However, since the transparent electrode has high resistance, the transparent electrode consumes electric power to cause the light-emitting element to have lower luminous efficiency. In addition, when ultraviolet light is emitted using ZnO for the light-emitting layer, the use of ZnO for the upper electrode causes the emitted ultraviolet light to be absorbed in the upper electrode.

The present invention has been made in view of the above problem, and it is an object of the present invention to provide a semiconductor device, a display device, and an electronic appliance each having a light-emitting element with excellent luminous efficiency from a top surface. Moreover, it is another object of the present invention to provide a manufacturing method of a semiconductor device.

SUMMARY OF THE INVENTION

In order to solve the aforementioned problem, a semiconductor device of the present invention includes: a first depressed portion or opening portion formed in an insulating film; a first electrode which is formed over the insulating film around the first depressed portion or opening portion, which is formed at a bottom surface and a side surface of the first depressed portion or opening portion, and which has a second depressed portion in the first depressed portion or opening portion; a semiconductor layer of a first conductivity type, which is formed over the first electrode and which has a third depressed portion in the second depressed portion; a light-emitting layer which is formed over the semiconductor layer of the first conductivity type and which has a fourth depressed portion in the third depressed portion; a semiconductor layer of a second conductivity type, which is formed over the light-emitting layer and which has a fifth depressed portion in the fourth depressed portion; and a second electrode formed over the semiconductor layer of the second conductivity type that forms a bottom surface and a side surface of the fifth depressed portion.

In this semiconductor device, the first electrode, the semiconductor layer of the first conductivity type, the light-emitting layer, and the semiconductor layer of the second conductivity type are formed along the bottom surface and the side surface of the first depressed portion or opening portion formed in the insulating film. Thus, light emitted from the light-emitting layer exits from a top surface of a light-emitting element after passing through the semiconductor layer of the second conductivity type. Therefore, the light emitted from the light-emitting layer exits from the top surface of the light-emitting element efficiently.

When the semiconductor layer of the second conductivity type has a smaller band gap than the light-emitting layer, the semiconductor layer of the second conductivity type is preferably thinner than the light-emitting layer. This makes it possible to suppress the absorption of light emitted from the light-emitting layer in the semiconductor layer of the second conductivity type.

A semiconductor device of the present invention includes: a first depressed portion or opening portion formed in an insulating film; a first electrode which is formed at a bottom surface and a side surface of the first depressed portion or opening portion and which has a second depressed portion in the first depressed portion or opening portion; a semiconductor layer of a first conductivity type, which is formed over the first electrode and which has a third depressed portion in the second depressed portion; a light-emitting layer which is formed over the semiconductor layer of the first conductivity type and which has a fourth depressed portion in the third depressed portion; a semiconductor layer of a second conductivity type, which is formed over the light-emitting layer and which has a fifth depressed portion in the fourth depressed portion; and a second electrode formed over the semiconductor layer of the second conductivity type that forms a bottom surface and a side surface of the fifth depressed portion. In this semiconductor device, an end face of the light-emitting layer has an angle of more than 90° and less than 270° to a surface of the insulating film.

In this semiconductor device, since the end face of the light-emitting layer has an angle of more than 90° and less than 270° to the surface of the insulating film, light emitted from the light-emitting layer exits upward from the end face of the light-emitting layer. Therefore, the light emitted from the light-emitting layer exits from the top surface of the light-emitting element efficiently.

The light-emitting layer may include a material having a band gap of 3 eV or more. In this case, the material included in the light-emitting layer is ZnO, ZnS, GaN, SiC, or $Mg_{1-x}Zn_xO$.

Each of materials included in the semiconductor layer of the first conductivity type and the semiconductor layer of the second conductivity type preferably has a larger band gap than a material included in the light-emitting layer. In this case, the light-emitting layer has higher luminous efficiency.

Moreover, when the light-emitting layer has a thickness of 10 nm or less, the light-emitting layer has further higher luminous efficiency because the light-emitting layer has a quantum well structure. In a case where the material included in the light-emitting layer is ZnO, the material included in the semiconductor layer of the first conductivity type and the material included in the semiconductor layer of the second conductivity type can be $Mg_{1-x}Zn_xO$ in which an impurity has been introduced.

The first electrode preferably has a reflectance of 90% or more with respect to light emitted from the light-emitting layer. In this case, light emitted downward from the light-emitting layer is reflected off the first electrode and exits from the top surface of the light-emitting element. Therefore, the light emitted from the light-emitting layer exits from the top surface of the light-emitting element further efficiently.

A semiconductor device of the present invention includes: a thin film transistor formed over a substrate; an insulating film positioned over the thin film transistor; and a light-emitting element which is formed over the insulating film and of which light emission is controlled by the thin film transistor. The light-emitting element includes: a first depressed portion or opening portion formed in the insulating film; a first electrode which is formed over the insulating film around the first depressed portion or opening portion, which is formed at a bottom surface and a side surface of the first depressed portion or opening portion, and which has a second depressed portion in the first depressed portion or opening portion; a semiconductor layer of a first conductivity type, which is formed over the first electrode and which has a third depressed portion in the second depressed portion; a light-emitting layer which is formed over the semiconductor layer of the first conductivity type and which has a fourth depressed portion in the third depressed portion; a semiconductor layer of a second conductivity type, which is formed over the light-emitting layer and which has a fifth depressed portion in the fourth depressed portion; and a second electrode formed over the semiconductor layer of the second conductivity type that forms a bottom surface and a side surface of the fifth depressed portion.

A semiconductor device of the present invention includes: a thin film transistor formed over a substrate; an insulating film positioned over the thin film transistor; and a light-emitting element which is formed over the insulating film and of which light emission is controlled by the thin film transistor. The light-emitting element includes: a first electrode which is formed at a bottom surface and a side surface of a first depressed portion or opening portion and which has a second depressed portion in the first depressed portion or opening portion; a semiconductor layer of a first conductivity type, which is formed over the first electrode and which has a third depressed portion in the second depressed portion; a light-emitting layer which is formed over the semiconductor layer of the first conductivity type and which has a fourth depressed portion in the third depressed portion; a semiconductor layer of a second conductivity type which is formed over the light-emitting layer and which has a fifth depressed portion in the fourth depressed portion; and a second electrode formed over the semiconductor layer of the second conductivity type that forms a bottom surface and a side surface of the fifth depressed portion. In the semiconductor device, an end face of the light-emitting layer has an angle of more than 90° and less than 270° to a surface of the insulating film.

The thin film transistor may include an island-shaped ZnO film and an impurity region which is formed in the ZnO film and which becomes a source or a drain of the thin film transistor. In this case, a semiconductor layer of the thin film transistor can be formed by a sputtering method. Thus, a flexible substrate or a plastic substrate can be used as the substrate.

A display device of the present invention includes: a thin film transistor formed over a substrate; an insulating film positioned over the thin film transistor; a light-emitting element which is formed over the insulating film, which emits ultraviolet light, and of which light emission is controlled by the thin film transistor; and a fluorescent body which is positioned over the light-emitting element and which emits visible light by absorbing the ultraviolet light emitted from the light-emitting element. The light-emitting element includes: a first depressed portion or opening portion formed in the insulating film; a first electrode which is formed over the insulating film around the first depressed portion or opening portion, which is formed at a bottom surface and a side surface of the first depressed portion or opening portion, and which has a second depressed portion in the first depressed portion or opening portion; a semiconductor layer of a first conductivity type, which is formed over the first electrode and which has a third depressed portion in the second depressed portion; a light-emitting layer which is formed over the semiconductor layer of the first conductivity type and which has a fourth depressed portion in the third depressed portion; a semiconductor layer of a second conductivity type, which is formed over the light-emitting layer and which has a fifth depressed portion in the fourth depressed portion; and a second electrode formed over the semiconductor layer of the second conductivity type that forms a bottom surface and a side surface of the fifth depressed portion.

A display device of the present invention includes: a thin film transistor formed over a substrate; an insulating film positioned over the thin film transistor; a light-emitting element which is formed over the insulating film, which emits ultraviolet light, and of which light emission is controlled by the thin film transistor; and a fluorescent body which is positioned over the light-emitting element and which emits visible light by absorbing the ultraviolet light emitted from the light-emitting element. The light-emitting element includes: a first depressed portion or opening portion formed in the insulating film; a first electrode which is formed at a bottom surface and a side surface of the first depressed portion or opening portion and which has a second depressed portion in the first depressed portion or opening portion; a semiconductor layer of a first conductivity type which is formed over the first electrode and which has a third depressed portion in the second depressed portion; a light-emitting layer which is formed over the semiconductor layer of the first conductivity type and which has a fourth depressed portion in the third depressed portion; a semiconductor layer of a second conductivity type which is formed over the light-emitting layer and which has a fifth depressed portion in the fourth depressed portion; and a second electrode formed over the semiconductor layer of the second conductivity type that forms a bottom surface and a side surface of the fifth depressed portion. In the semiconductor device, an end face of the light-emitting layer has an angle of more than 90° and less than 270° to a surface of the insulating film.

The thin film transistor may include an island-shaped ZnO film and an impurity region which is formed in the ZnO film and which becomes a source or a drain of the thin film transistor. In this case, a flexible substrate or a plastic substrate can be used as the substrate.

An electronic appliance of the present invention is provided with any of the aforementioned semiconductor devices and display devices.

A manufacturing method of a semiconductor device of the present invention includes: forming a first depressed portion or opening portion in an insulating film; forming a second depressed portion in the first depressed portion or opening portion, by forming a first conductive film over the insulating film and at a bottom surface and a side surface of the first depressed portion or opening portion; forming a third depressed portion in the second depressed portion, by forming a semiconductor layer of a first conductivity type over the first conductive film; forming a fourth depressed portion in the third depressed portion, by forming a light-emitting layer over the semiconductor layer of the first conductivity type; forming a fifth depressed portion in the fourth depressed portion, by forming a semiconductor layer of a second conductivity type over the light-emitting layer; forming a second conductive film over the semiconductor layer of the second conductivity type; and removing by selective etching, a part of the first and second conductive films, the semiconductor layer of the first conductivity type, the semiconductor layer of the second conductivity type, and the light-emitting layer, that is positioned over the insulating film.

A manufacturing method of a semiconductor device of the present invention includes: forming a first depressed portion or opening portion in an insulating film; forming a second depressed portion in the first depressed portion or opening portion, by forming a first conductive film over the insulating film and at a bottom surface and a side surface of the first depressed portion or opening portion; forming a third depressed portion in the second depressed portion, by forming a semiconductor layer of a first conductivity type over the first conductive film; forming a fourth depressed portion in the third depressed portion, by forming a light-emitting layer over the semiconductor layer of the first conductivity type; forming a fifth depressed portion in the fourth depressed portion, by forming a semiconductor layer of a second conductivity type over the light-emitting layer; forming a second conductive film over the semiconductor layer of the second conductivity type; and removing by polishing or etch-back, a part of the first and second conductive films, the semiconductor layer of the first conductivity type, the semiconductor layer of the second conductivity type, and the light-emitting layer, that is positioned over the insulating film.

A manufacturing method of a semiconductor device of the present invention includes: forming a thin film transistor over a substrate; forming an insulating film over the thin film transistor; forming a first depressed portion in the insulating film and over the thin film transistor; forming a connection hole at a bottom surface of the first depressed portion and over a source or a drain of the thin film transistor; forming a second depressed portion in the first depressed portion, by forming a first conductive film which is electrically connected to the source or the drain through the connection hole over the insulating film and at the bottom surface and a side surface of the first depressed portion; forming a third depressed portion in the second depressed portion, by forming a semiconductor layer of a first conductivity type over the first conductive film; forming a fourth depressed portion in the third depressed portion, by forming a light-emitting layer over the semiconductor layer of the first conductivity type; forming a fifth depressed portion in the fourth depressed portion, by forming a semiconductor layer of a second conductivity type over the light-emitting layer; forming a second conductive film over the semiconductor layer of the second conductivity type, and removing by selective etching, a part of the first and second conductive films, the semiconductor layer of the first conductivity type, the semiconductor layer of the second conductivity type, and the light-emitting layer, that is positioned over the insulating film.

A manufacturing method of a semiconductor device of the present invention includes: forming a thin film transistor over a substrate; forming an insulating film over the thin film transistor; forming a first depressed portion in the insulating film and over the thin film transistor; forming a connection hole at a bottom surface of the first depressed portion and over a source or a drain of the thin film transistor; forming a second depressed portion in the first depressed portion, by forming a first conductive film which is electrically connected to the source or the drain through the connection hole over the insulating film and at the bottom surface and a side surface of the first depressed portion; forming a third depressed portion in the second depressed portion, by forming a semiconductor layer of a first conductivity type over the first conductive film; forming a fourth depressed portion in the third depressed portion, by forming a light-emitting layer over the semiconductor layer of the first conductivity type; forming a fifth depressed portion in the fourth depressed portion, by forming a semiconductor layer of a second conductivity type over the light-emitting layer; forming a second conductive film over the semiconductor layer of the second conductivity type, and removing by polishing or etch-back, a part of the first and second conductive films, the semiconductor layer of the first conductivity type, the semiconductor layer of the second conductivity type, and the light-emitting layer, that is positioned over the insulating film.

In accordance with the present invention, as described above, light emitted from the light-emitting layer can exit from the top surface of the light-emitting element efficiently. Moreover, the intensity of light which exits from the top surface per unit area can be increased. In addition, a display device can be formed in which ultraviolet light emitted from the light-emitting element is absorbed by a fluorescent film or the like and this fluorescent film emits R, G or B light. Therefore, the luminous efficiency of the display device can be improved. Furthermore, the lifetime of the display device can be made longer than that of a display device using organic EL.

BRIEF DESCRIPTION OF DRAWINGS

In the accompanying drawings:

FIG. 4 is a schematic perspective view showing a structure of a pixel 42 of a display device of Embodiment Mode 4;

FIG. 10 is a plan view showing color arrangement of a fluorescent film of each pixel;

DETAILED DESCRIPTION OF THE INVENTION

EMBODIMENT MODE 1

Figure 1A:
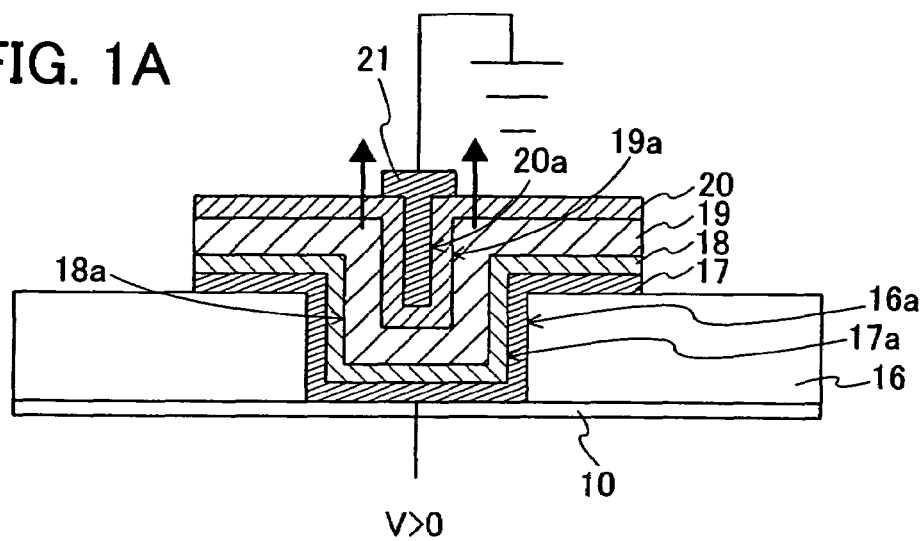
FIG. 1A is a cross-sectional view and FIG. 1B is a plan view, both showing a structure of a light-emitting element of Embodiment Mode 1.
Figure 1B:
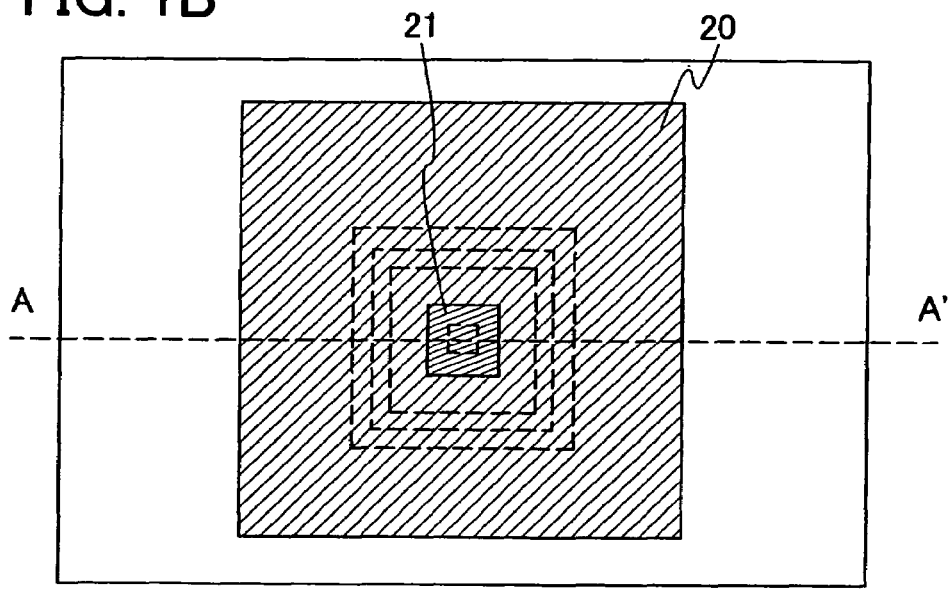

An embodiment mode of the present invention will hereinafter be described with reference to drawings. FIG. 1A is a cross-sectional view for explaining a structure of a light-emitting element in accordance with Embodiment Mode 1 of the present invention. FIG. 1B is a plan view of this light-emitting element. It is to be noted that FIG. 1A shows a cross section along a line A-A' of FIG. 1B. In this light-emitting element, an insulating film 16 is formed over a substrate 10. The substrate 10 is, for example, a glass substrate. The insulating film 16 is, for example, a silicon oxide film with a thickness of, for example, 0.5 to 1.5 μm. An opening portion 16a is formed in the insulating film 16. A bottom surface of the opening portion 16a is, for example, a square with a length of 2.5 μm on a side.

A lower electrode 17 is formed over the insulating film 16 around the opening portion 16a and over a bottom surface and a side surface of the opening portion 16a. The lower electrode 17 forms a first depressed portion 17a together with the opening portion 16a. Such a structure can be realized by adjusting the film thickness of the lower electrode 17 with respect to the shape of the opening portion 16a. The film thickness of the lower electrode 17 is, for example, in the range of 100 to 300 nm (for example, 200 nm). The lower electrode 17 is desirably formed using a material with sufficiently high reflectance (for example 90% or more) with respect to light emitted from a light-emitting layer 19. If the light-emitting layer 19 emits ultraviolet light, the lower electrode 17 is formed using, for example, Al.

A p-type semiconductor layer 18, the light-emitting layer 19, and an n-type semiconductor layer 20 are stacked in this order over the lower electrode 17. The p-type semiconductor layer 18 has a second depressed portion 18a in the first depressed portion 17a. The light-emitting layer 19 has a third depressed portion 19a in the second depressed portion 18a. The n-type semiconductor layer 20 has a fourth depressed portion 20a in the third depressed portion 19a. Such a structure can be realized by adjusting the film thickness of each of the p-type semiconductor layer 18, the light-emitting layer 19, and the n-type semiconductor layer 20. For example, the p-type semiconductor layer 18, the light-emitting layer 19, and the n-type semiconductor layer 20 have a film thickness of 100 to 500 nm (for example, 200 nm), a film thickness of 500 to 1000 nm (for example, 500 nm), and a film thickness of 100 to 500 nm (for example, 200 nm), respectively. However, the n-type semiconductor layer 20 is preferably thinner than the light-emitting layer 19, and the n-type semiconductor layer 20 more preferably has ½ or less thickness of the light-emitting layer 19. Then, absorption of light emitted from the light-emitting layer 19 in the n-type semiconductor layer 20 can be suppressed as later described, and the light can exit from the top surface of the light-emitting element efficiently.

The p-type semiconductor layer 18, the light-emitting layer 19, and the n-type semiconductor layer 20 are, for example, a p-type ZnO layer, a ZnO layer (with a band gap of 3.4 eV) not including impurities, and an n-type ZnO layer, respectively. The p-type ZnO is, for example, ZnO in which phosphorus is introduced. The n-type ZnO layer is, for example, ZnO in which Al or Ga is introduced. The light-emitting layer 19 can be formed by a ZnS layer (with a band gap of 3.68 eV), a GaN layer (with a band gap of 3.36 eV), an SiC layer (with a band gap of 3.0 eV), or $Mg_{1-x}Zn_xO$ (mixed crystal semiconductor of MgO and ZnO: with a band gap of 3.4 eV or more and 7.8 eV or less). When the light-emitting layer 19 has a band gap of 3 eV or more, the light-emitting layer 19 can emit ultraviolet light. When the light-emitting layer 19 is formed of GaAs (with a band gap of 1.42 eV), the p-type semiconductor layer 18 can be formed of $Al_{1-x}Ga_xAs$ with Zn introduced therein and the n-type semiconductor layer 20 can be formed of $Al_{1-x}Ga_xAs$ with Si introduced therein. $Al_{1-x}Ga_xAs$ is a mixed crystal of GaAs and AlAs and has a band gap of 1.42 eV to 2.17 eV. In this structure, light in an infrared region is emitted.

If each of the p-type semiconductor layer 18 and the n-type semiconductor layer 20 is formed of a material with a higher band gap than the light-emitting layer 19, the light-emitting layer 19 can have higher luminous efficiency. In this case, since a quantum well structure can be obtained by decreasing the film thickness of the light-emitting layer 19 (for example 10 nm or less), the luminous efficiency can be improved further. When the light-emitting layer 19 is formed of ZnO, the use of $Mg_{1-x}Zn_xO$ with Al or Ga introduced therein as the p-type semiconductor layer 18 and the use of $Mg_{1-x}Zn_xO$ with phosphorus introduced therein as the n-type semiconductor layer 20 can increase the band gaps of the p-type semiconductor layer 18 and the n-type semiconductor layer 20 so as to be higher than that of the light-emitting layer 19.

The n-type semiconductor layer 20, the light-emitting layer 19, and the p-type semiconductor layer 18 may be stacked in this order over the lower electrode 17. In this case, the p-type semiconductor layer 18 is preferably thinner than the light-emitting layer 19; specifically, the p-type semiconductor layer 18 preferably has a thickness of 100 to 500 nm. In particular, the film thickness of the p-type semiconductor layer 18 is more preferably ½ or less of that of the light-emitting layer 19.

An upper electrode 21 is formed over the n-type semiconductor layer 20 in the fourth depressed portion 20a and its periphery. The upper electrode 21 is formed using metal such as Al, and is in contact with the entire surface of the n-type semiconductor layer 20 that forms a side surface and a bottom surface of the fourth depressed portion 20a. However, it is necessary that the upper electrode 21 do not overlap with a portion of the light-emitting layer 19 that extends in a direction approximately perpendicular to the substrate 10 when viewed in a direction perpendicular to the substrate 10. That is, when viewed in a direction perpendicular to the substrate 10, edge sides of the upper electrode 21, the edge sides being formed with a patterning have only to be inside the third depressed portion 19a. Then, light emitted from the light-emitting layer 19 can exit from the top surface of the light-emitting element efficiently as later described.

In order to make the light-emitting element shown in this drawing emit light, for example, the upper electrode 21 is grounded and moreover a potential in a positive direction is given to the lower electrode 17. Then, excitons are recombined in the light-emitting layer 19 and the energy released at the combination is emitted as light. Since the upper electrode 21 does not overlap with a portion of the light-emitting layer 19 that extends in an upper direction in the drawing, light emitted upward in the drawing exits from the top surface of the light-emitting element after passing through the n-type semiconductor layer 20. The light emitted downward in the drawing is reflected off the lower electrode 17 and exits from the top surface of the light-emitting element. Since the n-type semiconductor layer 20 is thinner than the light-emitting layer 19 as described above, absorption of light emitted from the light-emitting layer 19 in the n-type semiconductor layer 20 can be suppressed, and the light can exit from the top surface efficiently.

It is to be noted that a light-emitting region of the light-emitting layer 19 corresponds to a region sandwiched between the lower electrode 17 and the upper electrode 21, i.e., a portion where the third depressed portion 19a is formed. Therefore, since the light-emitting region can be obtained in a direction perpendicular to the substrate 10, the intensity of light which exits from the top surface per unit area can be increased.

Next, a manufacturing method of the light-emitting element shown in FIGS. 1A and 1B is described. First, the insulating film 16 is formed over the substrate 10 by a CVD method. Next, a resist pattern is formed over the insulating film 16, and the insulating film 16 is selectively etched by using this resist pattern as a mask. Thus, the opening portion 16a is formed in the insulating film 16. After that, the resist pattern is removed.

Next, the lower electrode 17 is formed over the entire surface of the insulating film 16 and at the bottom surface and the side surface of the opening portion 16a by a sputtering method in which an Al target is used, for example. Subsequently, the p-type semiconductor layer 18 is formed over the lower electrode 17 by a sputtering method. As a target, for example, a ZnO target containing phosphorus is used.

Then, the light-emitting layer 19 is formed over the entire surface of the p-type semiconductor layer 18 by a sputtering method in which, for example, a ZnO target and a nitrogen atmosphere are used. Subsequently, the n-type semiconductor layer 20 is formed over the entire surface of the light-emitting layer 19 by a sputtering method. A ZnO target containing Ga or Al is used for example. Next, the upper electrode 21 is formed over the entire surface of the n-type semiconductor layer 20 by a sputtering method in which an Al target is used, for example.

The p-type semiconductor layer 18 may be formed by a method in which a semiconductor layer is formed by a sputtering method and then an impurity such as phosphorus is introduced therein. The n-type semiconductor layer 20 may be formed by a method in which a chip including an impurity to be introduced (for example, an Al chip or a Ga chip) is mounted on a target including a semiconductor (for example, a ZnO target) and these are simultaneously sputtered.

Subsequently, a resist pattern is formed over the upper electrode 21, and the upper electrode 21 is selectively etched using this resist pattern as a mask. Thus, the upper electrode 21 is removed except a part thereof that is positioned in the fourth depressed portion 20a and its periphery. After that, the resist pattern is removed.

Next, a resist pattern is formed over the upper electrode 21 and the n-type semiconductor layer 20, and the n-type semiconductor layer 20, the light-emitting layer 19, the p-type semiconductor layer 18, and the lower electrode 17 are selectively etched by using this resist pattern as a mask. Thus, the n-type semiconductor layer 20, the light-emitting layer 19, the p-type semiconductor layer 18, and the lower electrode 17 are removed except a part thereof that is positioned in the opening portion 16a and its periphery. After that, the resist pattern is removed.

As aforementioned, in accordance with Embodiment Mode 1 of the present invention, the lower electrode 17, the p-type semiconductor layer 18, the light-emitting layer 19, and the n-type semiconductor layer 20 of the light-emitting element are formed along the bottom surface and the side surface of the opening portion 16a formed in the insulating film 16. Although the upper electrode 21 is formed in the fourth depressed portion 20a and its periphery, the upper electrode 21 does not overlap with a portion of the light-emitting layer 19 that extends in an upper direction in the drawing. Therefore, the light emitted from the light-emitting layer 19 exits from the top surface of the light-emitting element after passing through the n-type semiconductor layer 20.

Accordingly, the light emitted from the light-emitting layer 19 exits from the top surface of the light-emitting element efficiently. The lower electrode 17 is formed using a material that reflects light emitted from the light-emitting layer 19; therefore, the light emitted from the light-emitting layer 19 can exit from the top surface of the light-emitting element further efficiently.

Since the light-emitting region of the light-emitting layer 19 can be obtained in a direction perpendicular to the substrate 10, the intensity of light which exits from the top surface per unit area can be increased.

When the p-type semiconductor layer 18, the light-emitting layer 19, and the n-type semiconductor layer 20 are respectively formed by, for example, a p-type ZnO layer, a ZnO layer not including an impurity, and an n-type ZnO layer which are materials that can be formed by a sputtering method, they can be formed at lower temperature. Thus, a substrate having lower heat resistance than a glass substrate, such as a flexible substrate or a plastic substrate can be used as the substrate 10.

When the refractive index of the light-emitting layer 19 is made higher than those of the p-type semiconductor layer 18 and the n-type semiconductor layer 20, the light-emitting layer 19 can be laser-oscillated. In this case, a semiconductor laser oscillation element with high luminous efficiency can be obtained.

EMBODIMENT MODE 2

Figure 2:
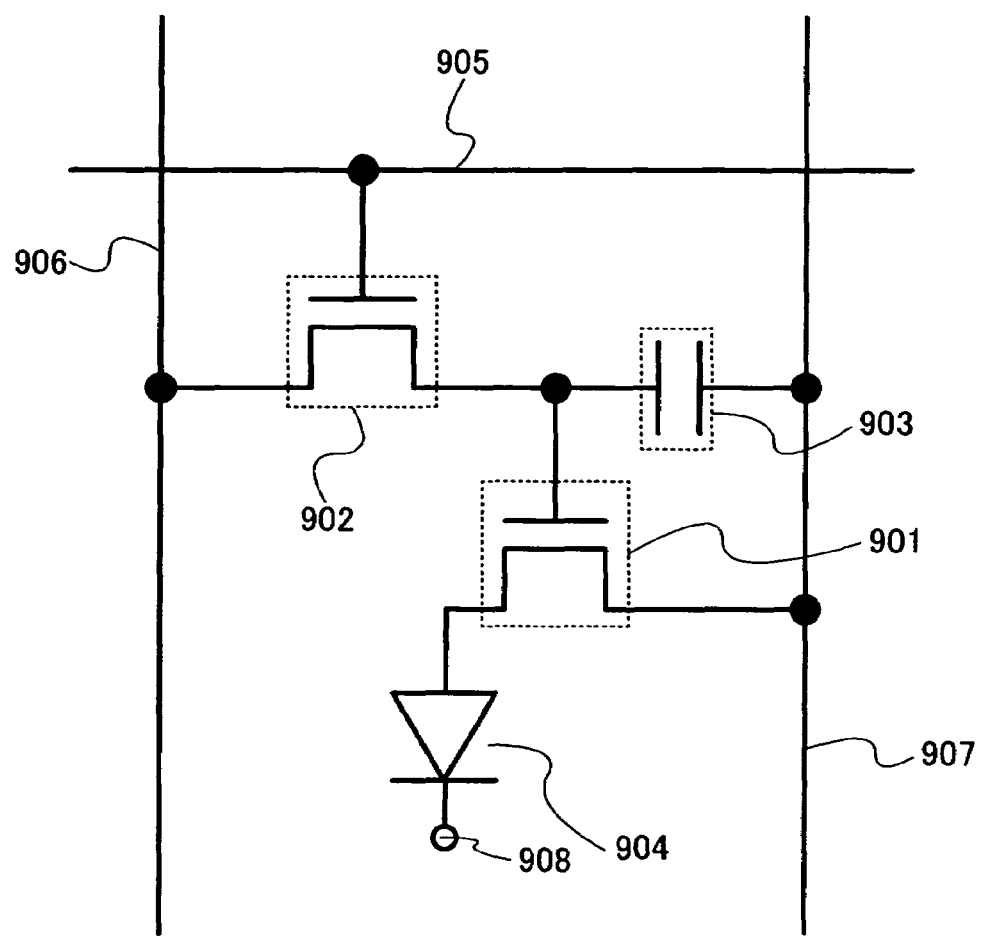
FIG. 2 is a circuit diagram showing a structure of a driving circuit of a light-emitting element of Embodiment Mode 2.

FIG. 2 is a circuit diagram for explaining a structure of a driving circuit of a light-emitting element in accordance with Embodiment Mode 2 of the present invention. In this embodiment mode, a light-emitting element 904 has a similar structure to that of the light-emitting element described in Embodiment Mode 1, and a counter electrode 908 corresponds to the upper electrode 21 of FIGS. 1A and 1B. An electrode corresponding to the lower electrode 17 is electrically connected to a power source line 907 with a driving TFT (thin film transistor) 901 interposed therebetween. A gate electrode of the driving TFT 901 is electrically connected to a signal line 906 with a switching TFT 902 interposed therebetween. A gate electrode of the switching TFT 902 is electrically connected to a scan line 905. It is to be noted that the gate electrode of the driving TFT 901 is also connected to the power source line 907 with a capacitor element 903 interposed therebetween.

In such a circuit, when a predetermined signal is inputted to the scan line 905, the switching TFT 902 is turned on and the signal line 906 is connected to the gate electrode of the driving TFT 901. When a predetermined signal is inputted to the signal line 906 in this state, the driving TFT 901 is turned on to connect the power source line 907 to the light-emitting element 904. In this state, the light-emitting element 904 emits light. By the provision of the capacitor element 903, a potential of the gate electrode of the driving TFT 901 is held easily.

The light-emitting element 904 has a similar structure to that of the light-emitting element described in Embodiment Mode 1. Therefore, this embodiment mode also provides an effect similar to Embodiment Mode 1, for example, an effect that light which exits from a top surface of the light-emitting element has high intensity.

EMBODIMENT MODE 3

Figure 3A:
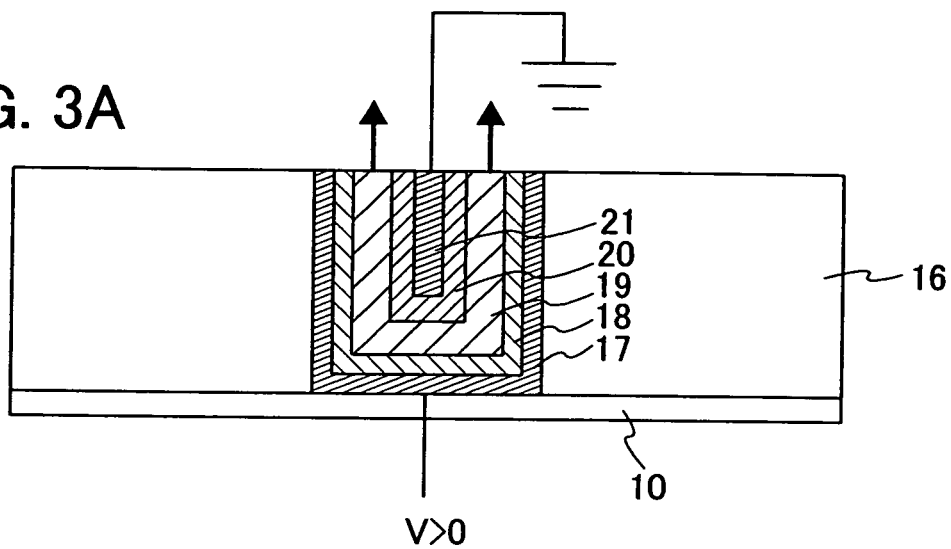
FIG. 3A is a cross-sectional view and FIG. 3B is a plan view, both showing a structure of a light-emitting element of Embodiment Mode 3.
Figure 3B:
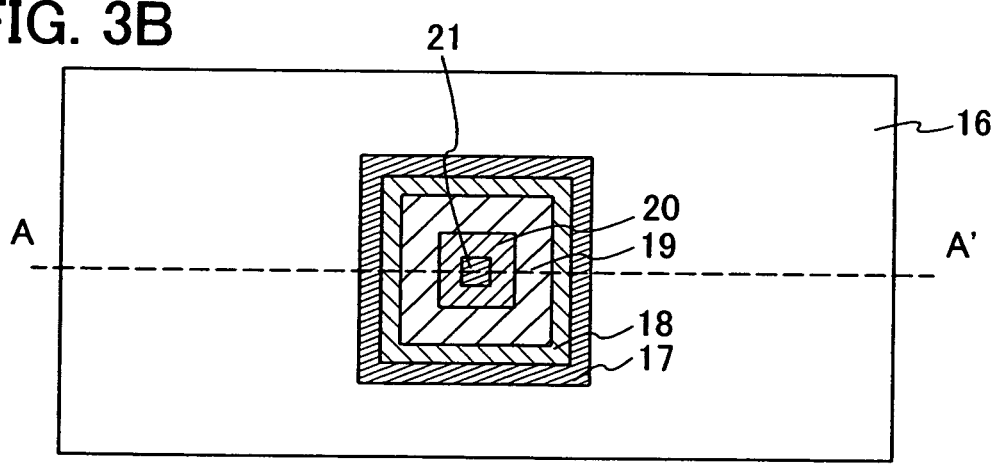

FIG. 3A is a cross-sectional view and FIG. 3B is a plan view, both explaining a structure of a light-emitting element in accordance with Embodiment Mode 3. It is to be noted that FIG. 3A shows a cross section along a line A-A' of FIG. 3B. The light-emitting element shown in this embodiment mode has the same structure as the light-emitting element shown in FIGS. 1A and 1B except that a portion protruding upward from the surface of the insulating film 16 is removed. Therefore, the content described in Embodiment Mode 1 can also be applied to this embodiment mode except that emitted light exits directly from an end face of the light-emitting layer 19. A structure similar to that of Embodiment Mode 1 is denoted by the same reference numeral and the description thereof is omitted hereinafter.

A manufacturing method of the light-emitting element of this embodiment mode is as follows. First, the insulating film 16 and the opening portion 16*a* are formed over the substrate 10. Moreover, the lower electrode 17, the p-type semiconductor layer 18, the light-emitting layer 19, the n-type semiconductor layer 20, and the upper electrode 21 are formed. These are formed by a similar method to that of Embodiment Mode 1.

Subsequently, a part of the lower electrode 17, the p-type semiconductor layer 18, the light-emitting layer 19, the n-type semiconductor layer 20, and the upper electrode 21, that is positioned over the insulating film 16 is removed by a CMP method or etch-back. Thus, an end face of each of the lower electrode 17, the p-type semiconductor layer 18, the light-emitting layer 19, the n-type semiconductor layer 20, and the upper electrode 21 becomes approximately flat with respect to the surface of the insulating film 16. Therefore, when viewed from a direction perpendicular to the insulating film 16, the end face of the light-emitting layer 19 can be observed and light emitted from the light-emitting layer 19 exits upward directly from the end face of the light-emitting layer 19.

It is to be noted that the end face of the light-emitting layer 19 has an angle of 180° to the surface of the insulating film 16 in this drawing. Here, "the angle of the end face of the light-emitting layer 19 to the surface of the insulating film 16" is defined. For example, a cross section perpendicular to both "the surface of the insulating film 16" and "the end face of the light-emitting layer 19" is considered, and a line by "the surface of the insulating film 16" and a line by "the end face of the light-emitting layer 19" at the cross section are considered. Then, an angle between the two lines with an apex being a point at which one of the lines extends to intersect with the other is the angle of the end face of the light-emitting layer 19 to the surface of the insulating film 16. If this angle is more than 90° and less than 270°, i.e., if the end face of the light-emitting layer 19 can be seen from above at this angle, the aforementioned effect can be obtained.

Thus, a similar effect to that of Embodiment Mode 1 can be obtained in accordance with this embodiment mode. Moreover, since light emitted from the light-emitting layer 19 exits upward directly from the end face of the light-emitting layer 19, the luminous efficiency can be improved further.

The insulating film 16 is preferably thicker than that in Embodiment Mode 1. In that case, even if the portion that is positioned over the insulating film 16 is removed, the area where the upper electrode 21 is in contact with the n-type semiconductor layer 20 can be enlarged sufficiently. Further, in the circuit shown in FIG. 2, the light-emitting element 904 may have a similar structure to that of the light-emitting element shown in this embodiment mode.

EMBODIMENT MODE 4

FIG. 4 is a schematic perspective view for explaining a structure of a pixel 42 in a display device of Embodiment Mode 4. In the display device of this embodiment mode, a plurality of pixels 42 are arranged in a matrix form. Each pixel 42 has a plurality of light-emitting elements 41 arranged in a matrix form. The light-emitting element 41 has a similar structure to that of the light-emitting element of any of Embodiment Modes 1 to 3. Thus, the content described in any of Embodiment Modes 1 to 3 can also be applied to this embodiment mode.

When the pixel 42 is a square with a length of 50 μm on a side and the light-emitting element 41 is a square with a length of 4.5 μm on a side, the pixel 42 can have 6×6 units of light-emitting elements 41 arranged therein. In this case, the light-emitting elements 41 are arranged at an interval of 3.5 μm. If the light-emitting element 41 is a square with a length of 4.5 μm on a side, the opening portion 16*a* shown in FIGS. 1A and 1B and FIGS. 3A and 3B may be a square with a length of 2.5 μm on a side and the thicknesses of the lower electrode 17, the p-type semiconductor layer 18, the light-emitting layer 19, and the n-type semiconductor layer 20 may be 200 nm, 200 nm, 500 nm, and 200 nm, respectively.

In this embodiment mode, since the light-emitting element 41 in the pixel 42 has a similar structure to the light-emitting element shown in any of Embodiment Modes 1 to 3, a display device with high luminous efficiency can be obtained.

Moreover, since the pixel 42 is formed by the plurality of light-emitting elements 41, variation in brightness of the pixels 42 can be suppressed even though the brightness of the light-emitting elements 41 varies. The cause of the variation in brightness of the light-emitting elements 41 includes variation between the light-emitting elements 41 themselves and variation between elements which control the light emission of the light-emitting elements 41 (for example, TFTs).

EMBODIMENT MODE 5

FIGS. 5A to 8 are drawings for explaining a manufacturing method of a semiconductor device of Embodiment Mode 5 of the present invention. In this manufacturing method, the light-emitting element described in Embodiment Mode 1, a TFT for driving this light-emitting element (such as the driving TFT 901 shown in FIG. 2), and a switching TFT (such as the switching TFT 902 shown in FIG. 2) are formed over one substrate. Thus, the content described in Embodiment Mode 1 can also be applied to this embodiment mode. A structure similar to that of Embodiment Mode 1 is denoted by the same reference numeral and the description thereof is omitted hereinafter.

Figure 5A:
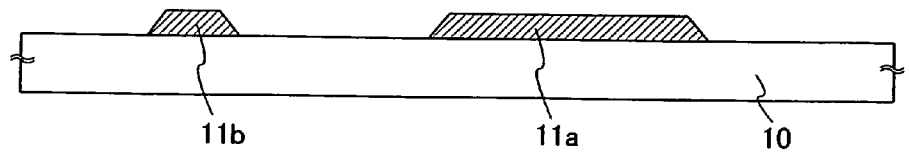
FIGS. 5A to 5D show a manufacturing method of a semiconductor device of Embodiment Mode 5.

First, a tungsten film is formed over the substrate 10 by a sputtering method as shown by a cross-sectional view of FIG. 5A. The tungsten film has a thickness of, for example, 150 nm. Next, a resist pattern is formed over the tungsten film, and the tungsten film is selectively etched by using this resist pattern. Accordingly, a gate electrode 11a of a driving transistor and a gate electrode 11b of a switching transistor are formed over the substrate 10. After that, the resist pattern is removed.

Figure 5B:
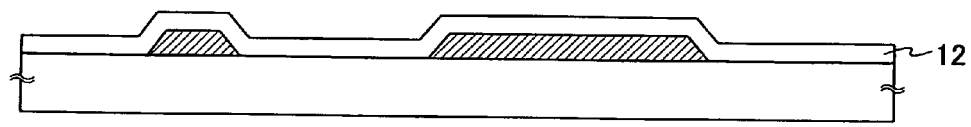

Next, a gate insulating film 12 is formed over the gate electrodes 11a and 11b and the substrate 10 by a sputtering method or a CVD method as shown by a cross sectional view of FIG. 5B. The gate insulating film 12 has a thickness of, for example, 100 nm. In a case of using a flexible substrate or a plastic substrate as the substrate 10, it is necessary to make the film-forming temperature lower than the heat resistance temperature of the substrate 10; therefore, a sputtering method is preferable. However, when the film-forming temperature can be made lower than the heat resistance temperature of the substrate 10, a CVD method can also be used.

Figure 5C:
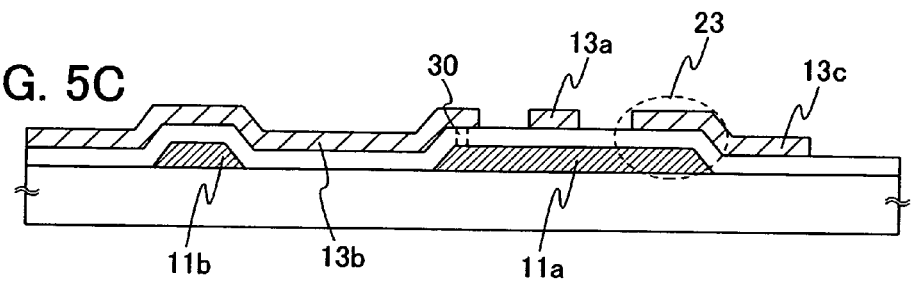

Next, as shown by a cross-sectional view of FIG. 5C, a resist pattern is formed over the gate insulating film 12, and the gate insulating film 12 is selectively etched by using this resist pattern as a mask. Thus, a connection hole 30 that is positioned over the gate electrode 11a is formed in the gate insulating film 12. After that, the resist pattern is removed.

Subsequently, a semiconductor film is formed over the gate insulating film 12. This semiconductor film has a thickness of, for example, 100 nm. The semiconductor film is, for example, a ZnO film. Alternatively, the semiconductor film may be a polysilicon film or an amorphous silicon film. When the semiconductor film is a ZnO film, the semiconductor film is formed by a sputtering method. In this case, since the film-forming temperature is low, a flexible substrate or a plastic substrate can be used as the substrate 10.

Next, a resist pattern is formed over the semiconductor film, and the semiconductor film is selectively etched. When the semiconductor film is a ZnO film, the semiconductor film is etched by wet etching using, for example, a hydrofluoric aqueous solution. Thus, an island-shaped semiconductor film 13a to be a driving transistor, an island-shaped semiconductor film 13b to be a switching transistor, and an island-shaped semiconductor film 13c are formed. The semiconductor film 13b is electrically connected to the gate electrode 11a through the connection hole 30. The semiconductor film 13c forms a capacitor element 23 together with the gate electrode 11a and the gate insulating film 12. It is to be noted that the semiconductor film 13c is connected to the semiconductor film 13a in a portion not shown in this drawing. After that, the resist pattern is removed.

Figure 5D:
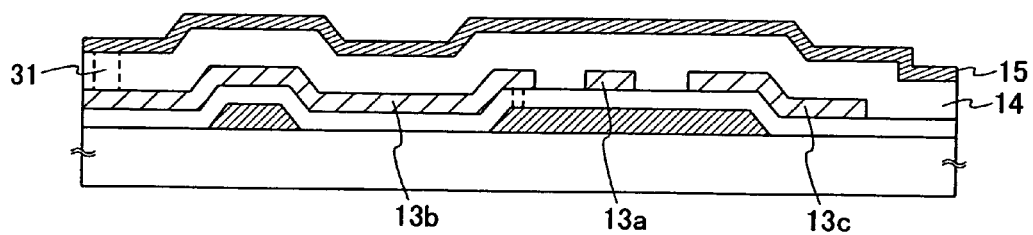

Subsequently, as shown by a cross-sectional view of FIG. 5D, a first interlayer insulating film 14 is formed over each of the semiconductor films 13a to 13c and over the gate insulating film 12 by, for example, a sputtering method. The first interlayer insulating film 14 is, for example, a silicon oxide film with a thickness of, for example, 500 nm. Then, a resist pattern is formed over the first interlayer insulating film 14 and the first interlayer insulating film 14 is selectively etched by using this resist pattern as a mask. Thus, a connection hole 31 positioned over the semiconductor film 13b and a connection hole 32 (shown in FIG. 6) positioned over the semiconductor film 13c are formed in the first interlayer insulating film 14. After that, the resist pattern is removed.

Subsequently, a conductive film is formed over the first interlayer insulating film 14 by a sputtering method. The conductive film is formed of, for example, an Al—Ti alloy. In this case, an Al—Ti alloy target is used as a sputtering target. The conductive film has a thickness of, for example, 200 nm. Next, a resist pattern is formed over the conductive film, and the conductive film is selectively etched by using this resist pattern as a mask. Thus, a signal line 15 and a power source line 22 (shown in FIG. 6) are formed. The signal line 15 is electrically connected to the semiconductor film 13b through the connection hole 31. The power source line 22 is electrically connected to the semiconductor films 13a and 13c through the connection hole 32. After that, the resist pattern is removed.

In this way, the driving TFT and the switching TFT for controlling the light-emitting element are formed. These TFTs are bottom-gate type TFTs; however, they may be top-gate type TFTs.

Figure 6:
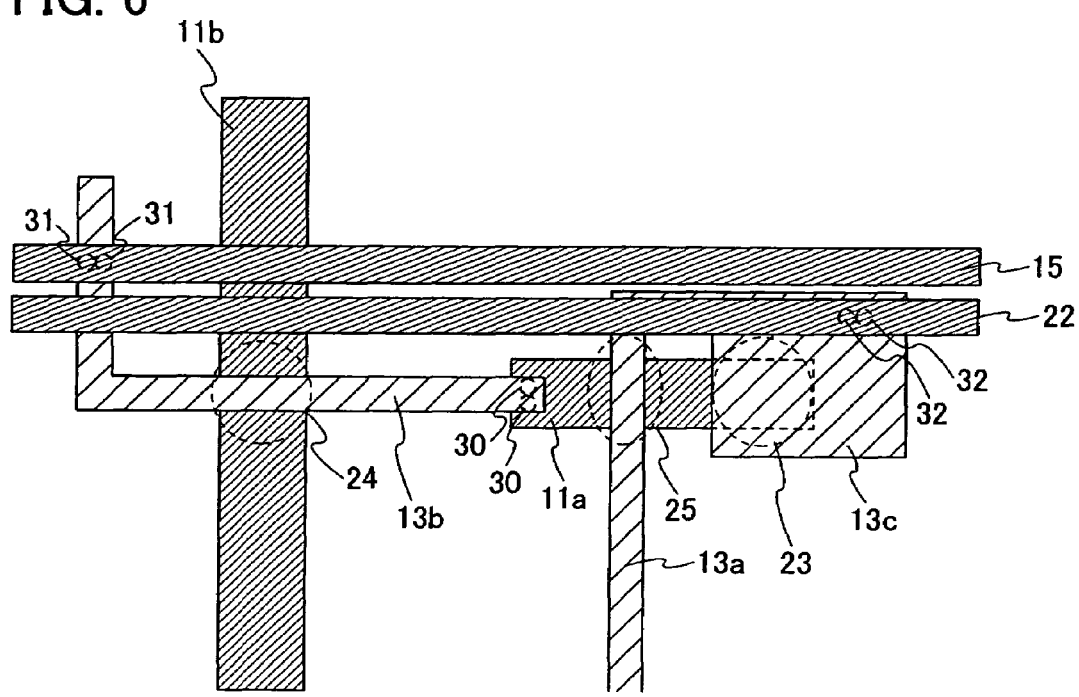
FIG. 6 shows a manufacturing method of a semiconductor device of Embodiment Mode 5.

Here, structures of a switching TFT 24 and a driving TFT 25 are described with reference to a plan view of FIG. 6. The switching TFT 24 is formed by the gate electrode 11b, the gate insulating film 12 (not shown in FIG. 6), and the semiconductor film 13b. The semiconductor film 13b is connected to the signal line 15 through a plurality of connection holes 31 and connected to the gate electrode 11a through a plurality of connection holes 30. The driving TFT 25 is formed by the gate electrode 11a, the gate insulating film 12, and the semiconductor film 13a. The semiconductor film 13a is connected to the semiconductor film 13c. The semiconductor film 13c is electrically connected to the power source line 22 through the plurality of connection holes 32. Thus, the semiconductor film 13a is electrically connected to the power source line 22 with the semiconductor film 13c interposed therebetween. It is to be noted that the signal line 15 and the power source line 22 are arranged in parallel to each other and the gate electrode 11b is perpendicular to the signal line 15 and the power source line 22.

A part of the semiconductor film 13c overlaps with a part of the gate electrode 11a with the gate insulating film 12 interposed therebetween and functions as the capacitor element 23. The capacitor element 23 functions as a capacitor that is electrically connected to the power source line 22 and the gate electrode 11a.

Figure 7A:
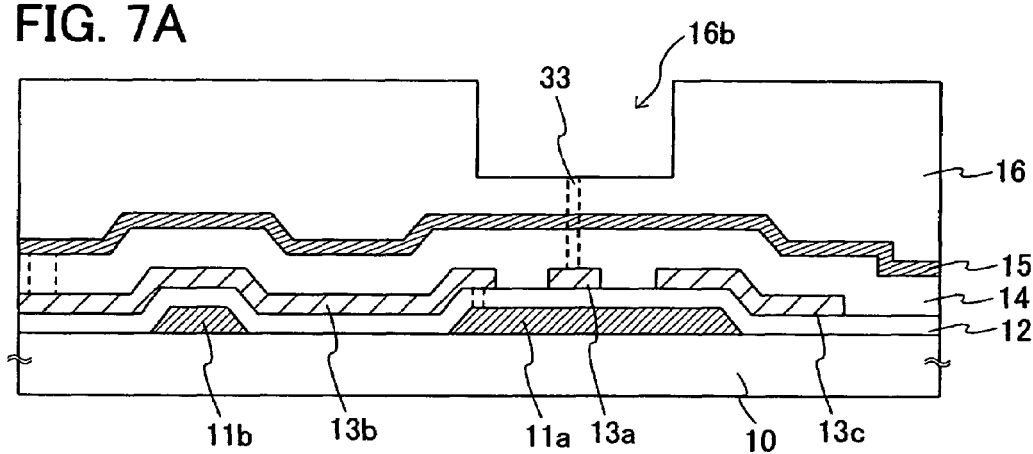
FIGS. 7A and 7B show a manufacturing method of a semiconductor device of Embodiment Mode 5.

Subsequently, as shown in FIG. 7A, the insulating film 16 is formed over the signal line 15, the power source line 22 (shown in FIG. 6), and the first interlayer insulating film 14. For example, the insulating film 16 is formed by a sputtering method. The insulating film 16 is, for example, a silicon oxide film with a thickness of, for example, 1000 to 1500 nm. Next, a resist pattern (not shown) is formed over the insulating film 16, and the insulating film 16 is etched by using this resist pattern as a mask. Thus, a depressed portion 16b positioned over the semiconductor film 13a is formed in the insulating film 16. The depressed portion 16b functions in place of the opening portion 16a in Embodiment Mode 1 and has a depth of, for example, 600 to 1000 nm. After that, the resist pattern is removed.

Subsequently, a resist pattern is formed in the depressed portion 16b and over the insulating film 16, and the insulating film 16 and the first interlayer insulating film 14 are etched by using this resist pattern as a mask. Thus, a connection hole 33 positioned over the semiconductor film 13a is formed in the first interlayer insulating film 14 and the insulating film 16 positioned at a bottom surface of the depressed portion 16b. After that, the resist pattern is removed.

Figure 7B:
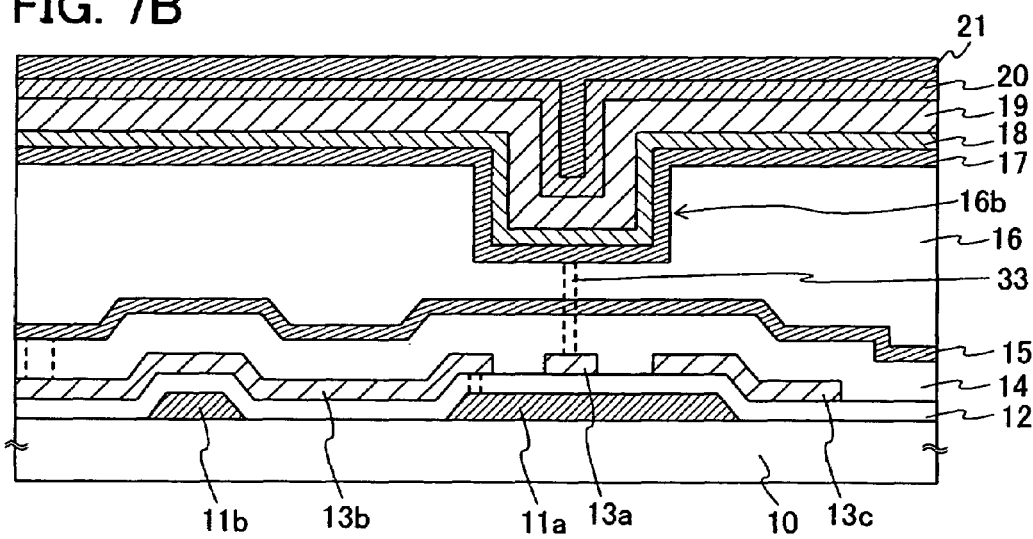

Subsequently, as shown in FIG. 7B, the lower electrode 17 is formed in the depressed portion 16b. The lower electrode 17 is formed by a similar method to that of Embodiment Mode 1. Since a part of the lower electrode 17 is embedded in the connection hole 33 when forming the lower electrode 17, the lower electrode 17 is electrically connected to the semiconductor film 13a through the connection hole 33.

After that, the p-type semiconductor layer 18, the light-emitting layer 19, the n-type semiconductor layer 20, and the upper electrode 21 are formed. These can be formed by a similar method to that of Embodiment Mode 1.

Figure 8:
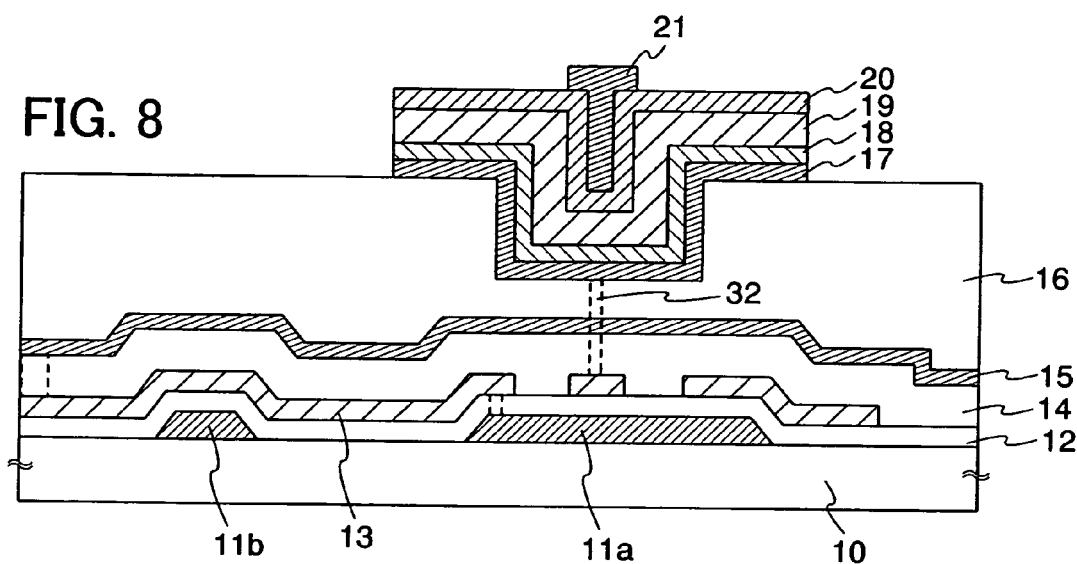
FIG. 8 shows a manufacturing method of a semiconductor device of Embodiment Mode 5.

Subsequently, as shown in FIG. 8, the p-type semiconductor layer 18, the light-emitting layer 19, the n-type semiconductor layer 20, and the upper electrode 21 are selectively removed. These are removed by a similar method to that of Embodiment Mode 1.

Thus, in accordance with Embodiment Mode 5, the luminous efficiency of the light-emitting element can be increased similarly to Embodiment Mode 1. Since the semiconductor films 13a and 13b of the TFTs are formed using ZnO that can be formed by a sputtering method, heat load applied to the substrate 10 can be reduced. Therefore, a flexible substrate or a plastic substrate can be used as the substrate 10. If the substrate 10 is a flexible substrate, a sheet display can be achieved. In a case of using a plastic substrate as the substrate 10, since a plastic substrate is less expensive and more lightweight than a glass substrate, the manufacturing cost and weight of a semiconductor device can be reduced.

Each of the semiconductor film 13a of the driving TFT 25 and the semiconductor film 13b of the switching TFT 24 is formed using ZnO with a band gap as high as 3.4 eV. Thus, differently from a Si-based TFT (band gap of 1.1 eV), operation error due to light excitation of carriers does not occur in the driving TFT 25 and the switching TFT 24 even when the TFTs are irradiated with visible light.

Moreover, since Zn is much contained in the crust (70 mg/kg), Zn can be easily obtained and is inexpensive. Thus, by using ZnO for both the TFT and the light-emitting element, material cost of a semiconductor device can be reduced.

If a heat-resistant substrate is used as the substrate 10, a polysilicon film or an amorphous silicon film can be used as the semiconductor films 13a and 13b. Alternatively, as the semiconductor films 13a and 13b, an organic semiconductor film formed of pentacene, oligothiophene, or the like can also be used.

In addition, since ZnO has a total transmittance of 90% or higher, when the gate electrodes 11a and 11b, the signal line 15, and the power source line 22 are formed using a transparent conductor (such as ITO, GZO (Ga-doped ZnO), or AZO (Al-doped ZnO)), the semiconductor device can be made transparent. In this case, a transparent display can be realized.

The light-emitting element may have the structure shown in Embodiment Mode 3.

EMBODIMENT MODE 6

Figure 9:
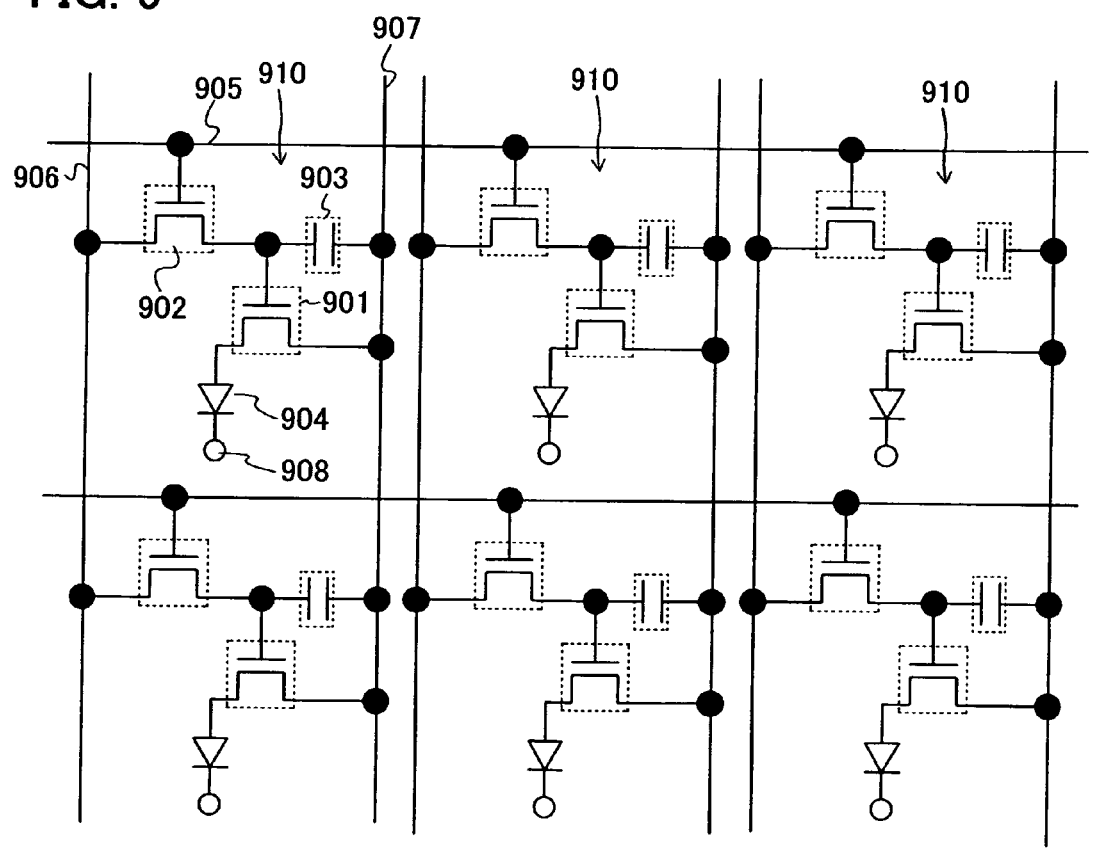
FIG. 9 is a circuit diagram showing a circuit structure of a display device of Embodiment Mode 6.

FIG. 9 is a circuit diagram for explaining a circuit structure of a display device in accordance with Embodiment Mode 6. FIG. 10 is a plan view for explaining color arrangement of a fluorescent film in each pixel. This display device has a plurality of pixels arranged in a matrix form. Each pixel has a circuit 910 having a similar structure to that of Embodiment Mode 2 shown in FIG. 9. Any of fluorescent films 912r, 912g, and 912b is provided over the light-emitting element 904 in the circuit 910 as shown in FIG. 10. Therefore, the content described in Embodiment Mode 2 can also be applied to this embodiment mode. A specific structure of each pixel is similar to that described in Embodiment Mode 5, for example.

In this embodiment mode, the light-emitting element 904 emits ultraviolet light and the fluorescent film absorbs the ultraviolet light emitted from the light-emitting element 904 and emits red, green, or blue light. A structure similar to that of Embodiment Mode 2 is denoted by the same reference numeral and the description thereof is omitted hereinafter. In the display device of this embodiment mode, a structure other than the fluorescent films 912r, 912g, and 912b is manufactured by, for example, the method described in Embodiment Mode 3. After that, the fluorescent films 912r, 912g, and 912b may be arranged at predetermined positions.

The fluorescent film 912r is a film emitting red light, which can be formed by using, for example, $Y_2O_2S:Eu^{3+}$, $La_2O_2S:Eu^{3+}$, $Li(Eu, Sm)W_2O_8$, $Ba_3MgSi_2O_8:Eu^{2+}$, or $Ba_3MgSi_2O_8:Mn^{2+}$. The fluorescent film 912g is a film emitting green light, which can be formed by using, for example, $ZnS:Cu$, $ZnS:Al$, $BaMgAl_{10}O_{17}:Eu^{2+}$, $BaMgAl_{10}O_{17}:Mn^{2+}$, or $SrGa_2S_4:Eu^{2+}$. The fluorescent film 912b is a film emitting blue light, which can be formed by using, for example, $(Sr, Ca, Ba, Mg)_{10}(PO_4)_6Cl_2:Eu^{2+}$, or $(Ba, Sr)MgAl_{10}O_{17}:Eu^{2+}$.

Although the light-emitting element 904 has a structure similar to that in Embodiment Mode 1, the light-emitting element 904 may have a structure similar to that of Embodiment Mode 3, for example. Moreover, the arrangement of red, green, and blue, i.e., the fluorescent films 912r, 912g, and 912b is not limited to the example shown in FIG. 10, and another arrangement may also be employed.

In accordance with this embodiment mode, light emitted from the light-emitting element 904 can exit efficiently from the top surface; therefore, the display device can be brighter while suppressing the power consumption. When the light-emitting element 904, the switching TFT 902, and the driving TFT 901 are formed by using ZnO, the temperature of the heat applied to the substrate during the manufacturing can be suppressed to be low. Thus, a flexible substrate or a plastic substrate can be used as the substrate. If a flexible substrate is used, a sheet display can be realized. If a plastic substrate is used, the manufacturing cost of the display device can be reduced.

Since the fluorescent films 912r, 912g, and 912b absorb ultraviolet light and emit red, green, and blue light, the luminous efficiency of red, green, and blue light is higher than that in a case of providing color filters over a white light source such as a white light-emitting diode or a white EL element. In addition, the light-emitting element 904 formed of an inorganic material is a light-emitting source. Therefore, the lifetime is longer and the reliability is higher than a display device using organic EL.

Although a light-emitting layer for emitting light of each color needs to be formed in the display device using organic EL, the light-emitting layer in this embodiment mode is formed by using one kind of material. Therefore, the manufacturing cost can be reduced as compared with the case of using organic EL.

Since low-voltage driving is possible by providing a TFT in each pixel as shown in this embodiment mode, this embodiment mode is advantageous in a case of higher pixel density.

Although this embodiment mode explains an active matrix display device in which each pixel is provided with a TFT, a passive matrix light-emitting device may also be employed. A passive matrix display device can have high aperture ratio because each pixel is not provided with a TFT. In a case of a display device where the emitted light exits from both sides of the light-emitting stacked-layer body, the transmittance is higher in the passive matrix type.

EMBODIMENT MODE 7

Figure 11A:
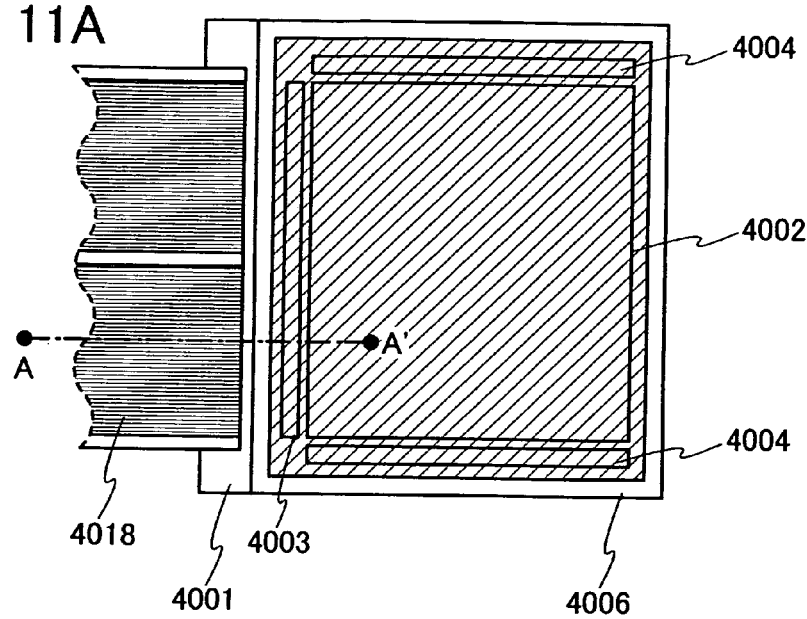
FIG. 11A is a top view and FIG. 11B is a cross-sectional view along a line A-A' of FIG. 11A, both showing a panel of Embodiment Mode 7.
Figure 11B:
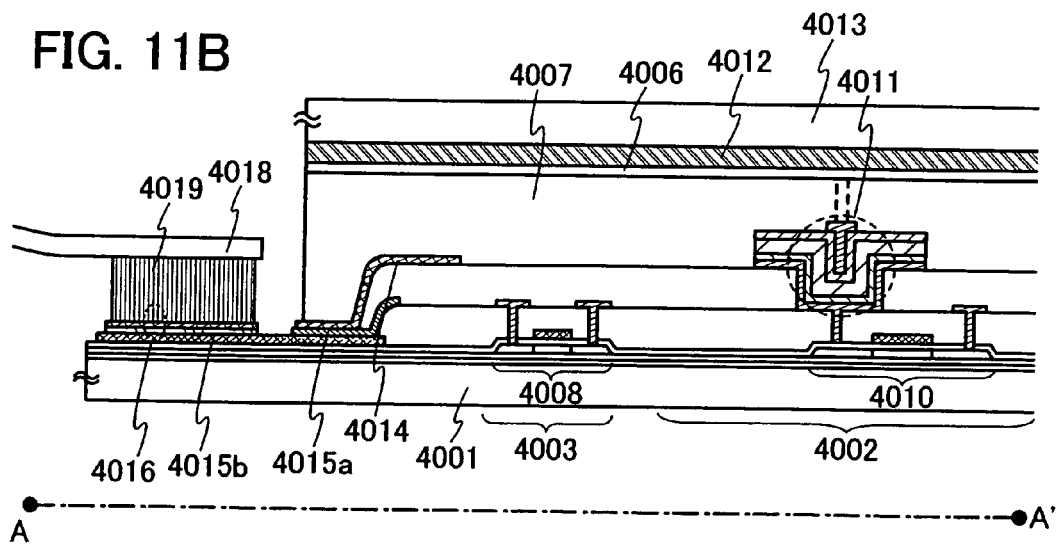

FIG. 11A is a top view of a panel of Embodiment Mode 7. FIG. 11B is a cross-sectional view along a line A-A' of FIG. 11A. This panel has, in its center, a pixel portion 4002 having a plurality of pixels arranged in a matrix form. A structure of each pixel in the pixel portion 4002 is similar to that of a pixel of the display device shown in Embodiment Mode 6, for example. A structure of a light-emitting element 4011 in each pixel is similar to that of the light-emitting element shown in Embodiment Mode 1 or 3, for example. In addition, each pixel may have a plurality of light-emitting elements 4011 as shown in Embodiment Mode 4. A structure of a circuit for driving the pixel is similar to that of the circuit shown in Embodiment Mode 2.

The light-emitting element 4011 is covered with an interlayer insulating film 4007. A transparent electrode 4006 is formed over the interlayer insulating film 4007. The transparent electrode 4006 is electrically connected to an upper electrode of the light-emitting element 4011 through a connection hole formed in the interlayer insulating film 4007. A fluorescent film 4012 is provided over the transparent electrode 4006. A counter substrate 4013 is provided over the fluorescent film 4012.

The interlayer insulating film 4007 can be formed using a silicon oxide film, a silicon oxynitride film, or a silicon nitride oxide film. As the counter substrate 4013, a glass substrate can be used. As the transparent electrode 4006, ITO (Indium Tin Oxide), ITSO (Indium Tin oxide containing Silicon Oxide), IZO (Indium Zinc Oxide), GZO (Gallium-doped ZnO), or AZO (Al-doped ZnO) can be used.

In addition, the substrate 4001 is provided with the pixel portion 4002, and a signal line driving circuit 4003 and a scan line driving circuit 4004 which are positioned around the pixel portion 4002. Each of the pixel portion 4002, the signal line driving circuit 4003, and the scan line driving circuit 4004 has a plurality of TFTs. FIG. 11B shows a TFT 4010 in the pixel portion 4002 and a TFT 4008 in the signal line driving circuit 4003. Although FIGS. 11A and 11B show a top-gate type TFT, a bottom-gate type TFT (as exemplified in Embodiment Mode 5) is also applicable. It is to be noted that a source or a drain of the TFT 4010 is electrically connected to the lower electrode of the light-emitting element 4011.

The panel is provided with a leading wire 4014. The leading wire 4014 is a wire for supplying a signal or a power source voltage to the signal line driving circuit 4003 and the scan line driving circuit 4004. The leading wire 4014 is connected to a connection terminal 4016 positioned at a periphery portion of the substrate 4001 with leading wires 4015a and 4015b interposed therebetween. The connection terminal 4016 is electrically connected to a terminal of an FPC (Flexible Printed Circuit) 4018 with an anisotropic conductive film 4019 interposed therebetween.

In accordance with this embodiment mode, a similar effect to that of Embodiment Mode 6, such as an effect of high luminous efficiency can be obtained.

It is to be noted that the signal line driving circuit 4003 is not necessarily formed over the substrate 4001. In this case, a TFT having a switching function is formed over the substrate 4001 and an IC to be connected to this TFT is mounted on the panel using an FPC or the like (this structure is a module). It is to be noted that this IC has functions of inputting a video signal to the TFT and controlling the TFT.

EMBODIMENT MODE 8

Figure 12A:
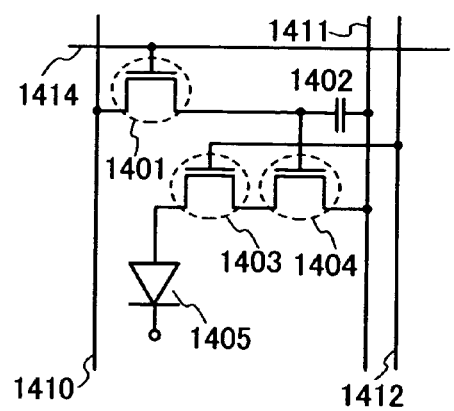
FIGS. 12A to 12E are circuit diagrams each showing a circuit structure of a panel or a module of Embodiment Mode 8.
Figure 12B:
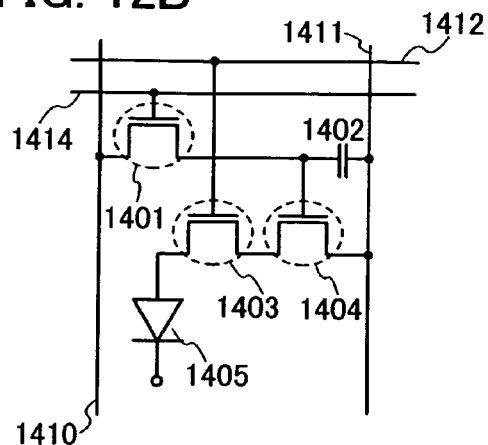
Figure 12C:
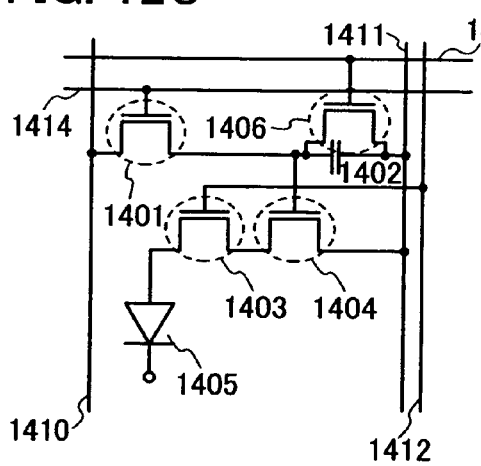
Figure 12D:
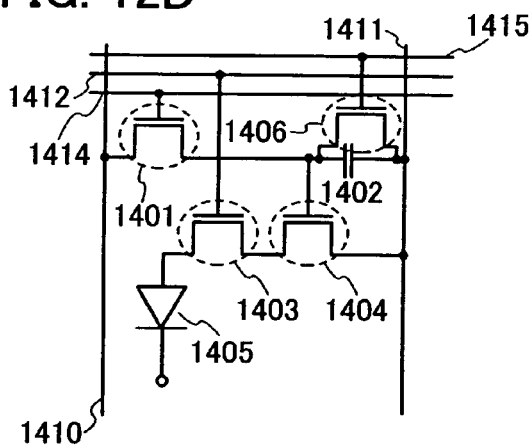
Figure 12E:
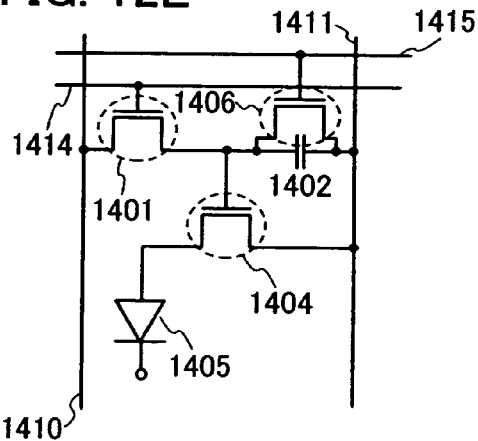
Figure 13:
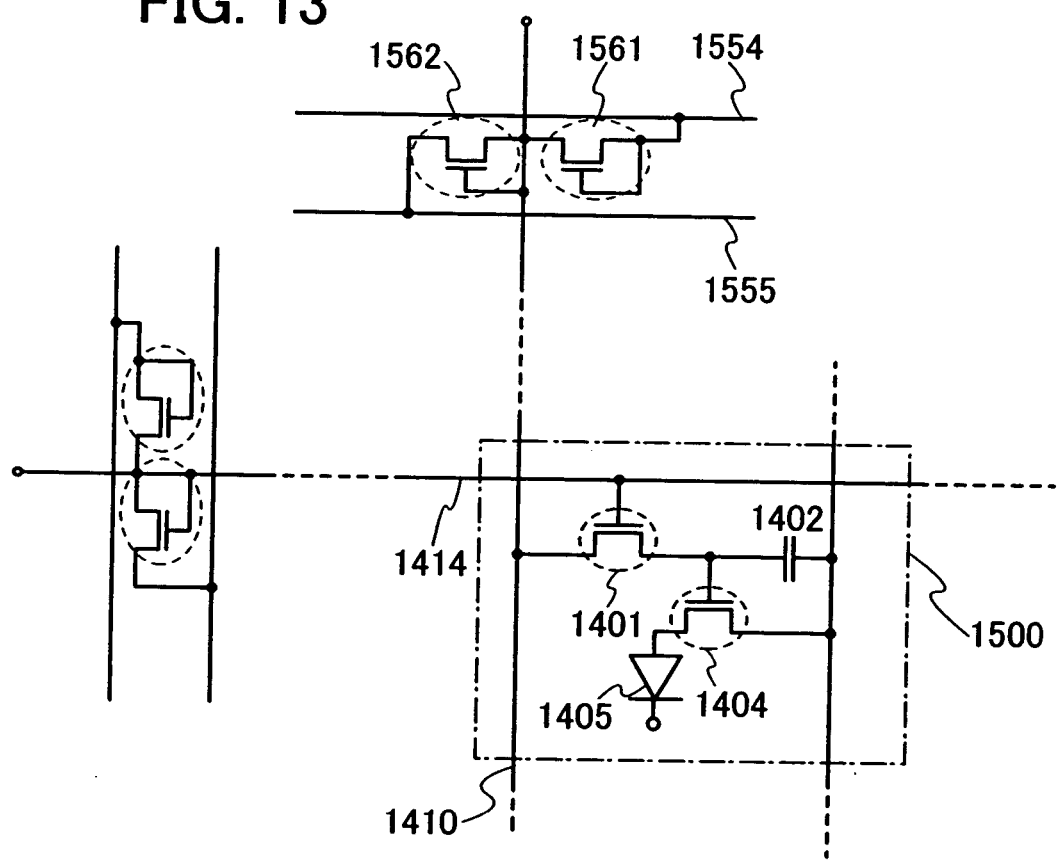
FIG. 13 is a circuit diagram showing a circuit structure of a panel or a module of Embodiment Mode 8.

Each of FIGS. 12A to 13 is a circuit diagram for describing a circuit structure of a panel or a module of Embodiment Mode 8. These drawings are to show modified examples of the circuit structure of the panel or the module shown in Embodiment Mode 7. A light-emitting element 1405 corresponds to the light-emitting element 4011 in Embodiment Mode 7. Moreover, a switching TFT 1401, a driving TFT 1404, and a capacitor element 1402 correspond to the switching TFT 902, the driving TFT 901, and the capacitor element 903 in Embodiment Mode 2, respectively. Thus, the content described in Embodiment Mode 2 can also be applied to this embodiment mode.

The switching TFT 1401 is a TFT which controls the input of a video signal to a pixel. When the switching TFT 1401 is turned on, a video signal is inputted to the pixel. Then, a voltage of the inputted video signal is held in the capacitor element 1402. If a gate capacitance or the like is large enough to hold the voltage of the video signal, the capacitor element 1402 is not necessarily provided.

In a circuit shown in FIG. 12A, a signal line 1410 and power source lines 1411 and 1412 extend in a column direction and a scan line 1414 extends in a row direction. A current controlling TFT 1403 is connected serially between the driving TFT 1404 and the light-emitting element 1405. A gate electrode of the current controlling TFT 1403 is electrically connected to the power source line 1412.

A circuit shown in FIG. 12B has a similar structure to the circuit shown in FIG. 12A except that the power source line 1412 extends in the row direction. In other words, FIG. 12B is an equivalent circuit diagram of FIG. 12A. However, the power source line 1412 is provided in different layers depending on whether the power source line 1412 extends in the column direction (the case of FIG. 12A) or in the row direction (the case of FIG. 12B). Here, in order to show that the power source line 1412 is provided in different layers, the power source line 1412 is shown separately in FIGS. 12A and 12B.

One feature of the circuits shown in FIGS. 12A and 12B is serial connection between the driving TFT 1404 and the current controlling TFT 1403 in the pixel. The current controlling TFT 1403 operates in a saturated region and has a function of controlling a value of current flowing in the light-emitting element 1405. The ratio of channel length (L1) to channel width (W1) of the current controlling TFT 1403 (L1/W1) is preferably 5000 times to 6000 times the ratio of channel length (L2) to channel width (W2) of the driving TFr 1404 (L2/W2).

These two TFTs 1403 and 1404 preferably have the same conductivity type (for example, n-channel TFTs) from the aspect of a manufacturing process. As the driving TFT 1404, not only an enhanced type TFT but also a depletion type TFT is applicable. This is because since the current controlling TFT 1403 operates in a saturated region, slight fluctuation of Vgs of the driving TFT 1404 does not affect the value of current flowing in the light-emitting element 1405. That is to say, the value of current in the light-emitting element 1405 is determined by the current controlling TFT 1403 operating in the saturated region. Such a structure makes it possible to suppress the variation in light-emitting characteristics due to the variation in characteristics of the TFT. When each pixel is formed by a plurality of light-emitting elements as shown in Embodiment Mode 4, the image quality and the reliability of the panel can be further improved because the variation in light emission between the pixels can be further suppressed.

A circuit shown in FIG. 12C has a similar structure to that of the circuit shown in FIG. 12A except that a TFT 1406 and a scan line 1415 are added. A circuit shown in FIG. 12D has a similar structure to that of the circuit shown in FIG. 12B except that the TFT 1406 and the scan line 1415 are added. The scan line 1415 extends in the row direction.

The TFT 1406 is provided in parallel to the capacitor element 1402. A gate electrode of the TFT 1406 is electrically connected to the scan line 1415, and turning on/off of the TFT 1406 is controlled by the scan line 1415. When the TFT 1406 is turned on, an electric charge held in the capacitor element 1402 is released to turn off the driving TFT 1404. In other words, the provision of the TFT 1406 can forcibly make a state that current does not flow in the light-emitting element 1405. Thus, the TFT 1406 can be called an erasing TFT.

In this manner, a lighting period can be started at the same time as or just after the start of a writing period without waiting for signals to be written in all the pixels in the circuits shown in FIGS. 12C and 12D; therefore, the duty ratio can be increased.

A circuit shown in FIG. 12E has a similar structure to those of the circuits shown in FIGS. 12C and 12D except that the power source line 1412 and the current controlling TFT 1403 are not provided. The structure of FIG. 12E can also have the duty ratio improved in a similar manner to the circuits shown in FIGS. 12C and 12D.

A circuit shown in FIG. 13 is provided with the switching TFT 1401, the capacitor element 1402, the driving TFT 1404, and the light-emitting element 1405 in a pixel portion 1500. The signal line 1410 is connected to diodes 1561 and 1562. The diodes 1561 and 1562 are formed by the same process as, for example, the switching TFT 1401 and the driving TFT 1404 and each have a gate electrode, a semiconductor layer, a source electrode, a drain electrode, and the like. Each of the diodes 1561 and 1562 operates as a diode by electrically connecting the gate electrode and one of the drain and source electrodes to each other.

The gate electrode and one of the drain electrode and the source electrode of the diode 1561 are electrically connected to a common potential line 1554, and the other of the drain electrode and the source electrode is connected to the signal line 1410. The gate electrode and one of the drain electrode and the source electrode of the diode 1562 are electrically connected to the signal line 1410, and the other of the drain electrode and the source electrode is connected to a common potential line 1555. The common potential lines 1554 and 1555 are formed in the same layer as the gate electrode and formed through the same process as the gate electrode. Therefore, in order to connect the source electrodes or the drain electrodes of the diodes 1561 and 1562 to the common potential lines, a connection hole is necessary in the gate insulating film.

Moreover, the scan line 1414 is also provided with a diode and a common potential line with their structures similar to the diodes 1561 and 1562 and the common potential lines 1554 and 1555.

In the circuit shown in FIG. 13, a protective diode can be formed through the same process as the TFTs. The position of the protective diode is not limited to this, and the protective diode can be formed between a driving circuit and a pixel.

EMBODIMENT MODE 9

Electronic appliances of Embodiment Mode 9 are described with reference to FIGS. 14A to 15. Each of these electronic appliances has the display device or the panel shown in any of Embodiment Modes 6 to 8. As the electronic appliances, a camera such as a video camera or a digital camera, a goggle type display (head mount display), a navigation system, a sound reproducing device (such as a car audio component), a computer, a game machine, a mobile information terminal (such as a mobile computer, a mobile phone, a mobile game machine, or an electronic book), an image reproducing device equipped with a storage medium (specifically a device which reproduces a storage medium such as a digital versatile disk (DVD) and which is provided with a display for displaying the image), and the like are given. Specific examples of these electronic appliances are shown in FIGS. 14A to 15.

Figure 14A:
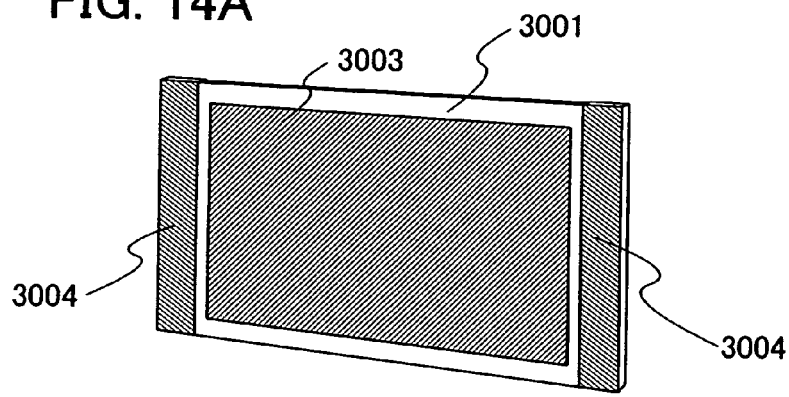
FIGS. 14A to 14E are perspective views showing structures of electronic appliances of Embodiment Mode 9.
Figure 15:
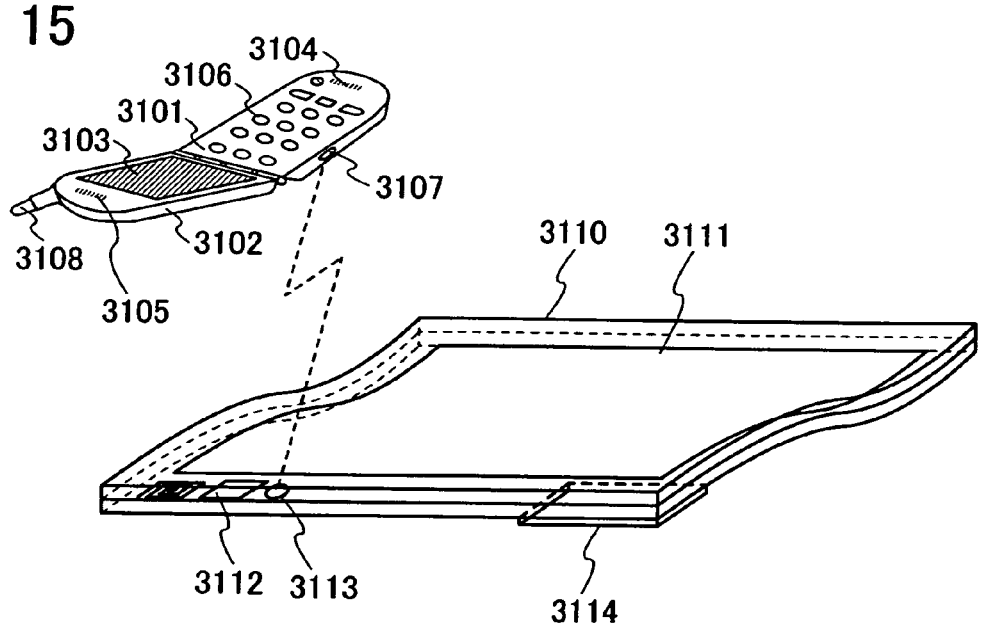
FIG. 15 is a perspective view showing a structure of an electronic appliance of Embodiment Mode 9.
Figure 16:
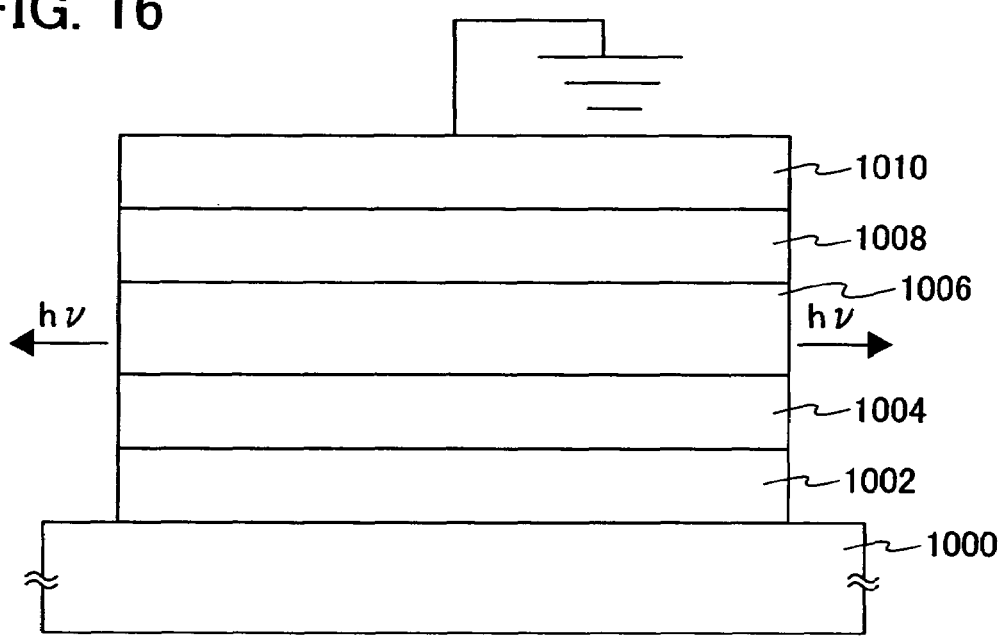
FIG. 16 is a cross-sectional view showing a structure of a conventional light-emitting element.

FIG. 14A shows a television image receiver or a monitor of a personal computer, which includes a housing 3001, a display portion 3003, a speaker portion 3004, and the like. The display portion 3003 is provided with an active matrix display device. As the display device, the display device or the panel shown in any of Embodiment Modes 6 to 8 is used. The light-emitting element of the display device or the panel emits R (red), G (green), or B (blue) light through the fluorescent films; therefore, the luminous efficiency is high as compared with a case of using color filters. Moreover, since the light-emitting element uses an inorganic semiconductor, the lifetime is long as compared with a case of using organic EL. When each pixel has a plurality of light-emitting elements as shown in Embodiment Mode 4, variation in light emission between the pixels can be suppressed. Therefore, display unevenness can be suppressed, thereby obtaining a television image receiver or a monitor with high image quality and high reliability.

Figure 14B:
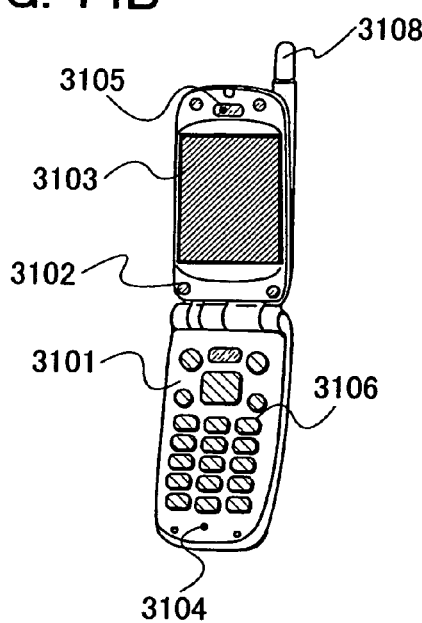

FIG. 14B shows a mobile phone device including a main body 3101, a housing 3102, a display portion 3103, an audio input portion 3104, an audio output portion 3105, operation keys 3106, an antenna 3108, and the like. The display portion 3103 is provided with an active matrix display device. As the display device, the display device or the panel shown in any of Embodiment Modes 6 to 8 is used. The light-emitting element of the display device or the panel emits R, G or B light through the fluorescent films; therefore, the luminous efficiency is high as compared with a case of using color filters. Moreover, since the light-emitting element uses an inorganic semiconductor, the lifetime is long as compared with a case of using organic EL. When each pixel has a plurality of light-emitting elements as shown in Embodiment Mode 4, variation in light emission between the pixels can be suppressed. Therefore, display unevenness can be suppressed, thereby obtaining a mobile phone device with high image quality and high reliability.

Figure 14C:
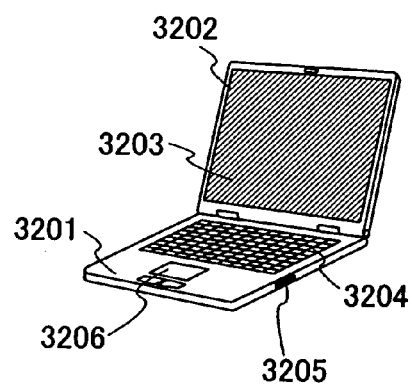

FIG. 14C shows a computer. A main body 3201 of the computer is provided with a keyboard 3204, an external connection port 3205, a pointing mouse 3206, and the like. Moreover, the main body 3201 has a housing 3202 having a display portion 3203 attached thereto. The display portion 3203 is provided with an active matrix display device. As the display device, the display device or the panel described in any of Embodiment Modes 6 to 8 is used. The light-emitting element of the display device or the panel emits R, G or B light through the fluorescent films; therefore, the luminous efficiency is high as compared with a case of using color filters. Moreover, since the light-emitting element uses an inorganic semiconductor, the lifetime is long as compared with a case of using organic EL. When each pixel has a plurality of light-emitting elements as shown in Embodiment Mode 4, variation in light emission between the pixels can be suppressed. Therefore, display unevenness can be suppressed, thereby obtaining a computer with high image quality and high reliability.

Figure 14D:
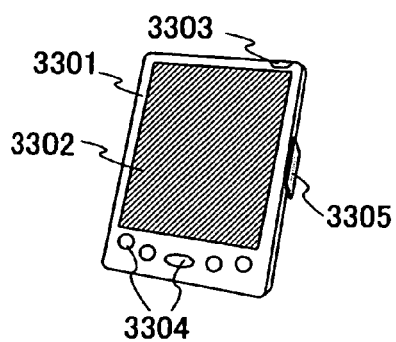

FIG. 14D shows a mobile computer including a main body 3301, a display portion 3302, a switch 3303, operation keys 3304, an infrared port 3305, and the like. The display portion 3302 is provided with an active matrix display device. As this display device, the display device or the panel described in any of Embodiment Modes 6 to 8 is used. The light-emitting element of the display device or the panel emits R, G, or B light through the fluorescent films; therefore, the luminous efficiency is high as compared with a case of using color filters. Moreover, since the light-emitting element uses an inorganic semiconductor, the lifetime is long as compared with a case of using organic EL. When each pixel has a plurality of light-emitting elements as shown in Embodiment Mode 4, variation in light emission between the pixels can be suppressed. Therefore, display unevenness can be suppressed, thereby obtaining a mobile computer with high image quality and high reliability.

Figure 14E:
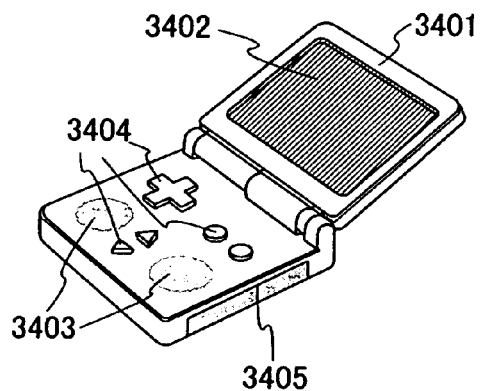

FIG. 14E shows a mobile game machine including a housing 3401, a display portion 3402, speaker portions 3403, operation keys 3404, a storage medium inserting portion 3405, and the like. The display portion 3402 is provided with an active matrix display device. As this display device, the display device or the panel described in any of Embodiment Modes 6 to 8 is used. The light-emitting element of the display device or the panel emits R (red), G (green), or B (blue) light through the fluorescent films; therefore, the luminous efficiency is high as compared with a case of using color filters. Moreover, since the light-emitting element uses an inorganic semiconductor, the lifetime is long as compared with a case of using organic EL. When each pixel has a plurality of light-emitting elements as shown in Embodiment Mode 4, variation in light emission between the pixels can be suppressed. Therefore, display unevenness can be suppressed, thereby obtaining a mobile game machine with high image quality and high reliability.

FIG. 15 shows a paper display including a main body 3110, a pixel portion 3111, a driver IC 3112, a receiving device 3113, a film battery 3114, and the like. The receiving device 3113 can receive a signal from an infrared communication port (not shown) of the mobile phone device shown in FIG. 14B. The pixel portion 3111 is provided with an active matrix display device. As this display device, the display device or the panel described in any of Embodiment Modes 6 to 8 is used. The light-emitting element of the display device or the panel emits R, G, or B light through the fluorescent films; therefore, the luminous efficiency is high as compared with a case of using color filters. Moreover, since the light-emitting element uses an inorganic semiconductor, the lifetime is long as compared with a case of using organic EL. When each pixel has a plurality of light-emitting elements as shown in Embodiment Mode 4, variation in light emission between the pixels can be suppressed. Therefore, display unevenness can be suppressed, thereby obtaining a paper display with high image quality and high reliability.

In this manner, the present invention can be applied in quite a wide range and can be applied to electronic appliances of every field.

It is to be noted that the present invention is not limited to the aforementioned embodiment modes and various modifications are possible without departing from the scope of the present invention.

This application is based on Japanese Patent Application serial no. 2005-366023 filed in Japan Patent Office on Dec. 20, 2005, the entire contents of which are hereby incorporated by reference.

What is claimed is:

1. A semiconductor device comprising:
a first depressed portion or opening portion formed in an insulating film;
a first electrode which is formed over the insulating film around the first depressed portion or opening portion, which is formed at a bottom surface and a side surface of the first depressed portion or opening portion, and which has a second depressed portion in the first depressed portion or opening portion;
a semiconductor layer of a first conductivity type, which is formed over the first electrode and which has a third depressed portion in the second depressed portion;
a light-emitting layer which is formed over the semiconductor layer of the first conductivity type and which has a fourth depressed portion in the third depressed portion;
a semiconductor layer of a second conductivity type which is formed over the light-emitting layer and which has a fifth depressed portion in the fourth depressed portion; and
a second electrode formed over the semiconductor layer of the second conductivity type that has a bottom surface and a side surface of the fifth depressed portion.

2. The semiconductor device according to claim 1, wherein the semiconductor layer of the second conductivity type has a band gap larger than the light-emitting layer, and
wherein the light-emitting layer is thinner than the semiconductor layer of the second conductivity type.

3. The semiconductor device according to claim 1, wherein the light-emitting layer includes a material with a band gap of 3 eV or more.

4. The semiconductor device according to claim 3, wherein the material included in the light-emitting layer is ZnO, ZnS, GaN, SiC, or $Mg_{1-x}Zn_xO$.

5. The semiconductor device according to claim 4, wherein the light-emitting layer has a thickness of 10 nm or less.

6. The semiconductor device according to claim 4, wherein the material included in the light-emitting layer is ZnO, and the material included in the semiconductor layer of the first conductivity type and the material included in the semiconductor layer of the second conductivity type are $Mg_{1-x}Zn_xO$ in which an impurity has been introduced.

7. The semiconductor device according to claim 1, wherein each of materials included in the semiconductor layer of the first conductivity type and the semiconductor layer of the second conductivity type has a larger band gap than the material included in the light-emitting layer.

8. The semiconductor device according to claim 1, wherein the first electrode has a reflectance of 90% or more to light emitted from the light-emitting layer.

9. An electronic appliance provided with the semiconductor device according to claim 1.

10. The semiconductor device according to claim 1, wherein edge sides of the second electrode is inside the third depressed portion.

11. A semiconductor device comprising:
a first depressed portion or opening portion formed in an insulating film;
a first electrode which is formed at a bottom surface and a side surface of the first depressed portion or opening portion and which has a second depressed portion in the first depressed portion or opening portion;
a semiconductor layer of a first conductivity type, which is formed over the first electrode and which has a third depressed portion in the second depressed portion;
a light-emitting layer which is formed over the semiconductor layer of the first conductivity type and which has a fourth depressed portion in the third depressed portion;
a semiconductor layer of a second conductivity type, which is formed over the light-emitting layer and which has a fifth depressed portion in the fourth depressed portion; and a second electrode formed over the semiconductor layer of the second conductivity type that has a bottom surface and a side surface of the fifth depressed portion, wherein an end face of the light-emitting layer has an angle of more than 90° and less than 270° to a surface of the insulating film.

12. The semiconductor device according to claim 11, wherein the light-emitting layer includes a material with a band gap of 3 eV or more.

13. The semiconductor device according to claim 12, wherein the material included in the light-emitting layer is ZnO, ZnS, GaN, SiC, or $Mg_{1-x}Zn_xO$.

14. The semiconductor device according to claim 13, wherein the light-emitting layer has a thickness of 10 nm or less.

15. The semiconductor device according to claim 13, wherein the material included in the light-emitting layer is ZnO, and the material included in the semiconductor layer of the first conductivity type and the material included in the semiconductor layer of the second conductivity type are $Mg_{1-x}Zn_xO$ in which an impurity has been introduced.

16. The semiconductor device according to claim 11, wherein each of materials included in the semiconductor layer of the first conductivity type and the semiconductor layer of the second conductivity type has a larger band gap than the material included in the light-emitting layer.

17. The semiconductor device according to claim 11, wherein the first electrode has a reflectance of 90% or more to light emitted from the light-emitting layer.

18. An electronic appliance provided with the semiconductor device according to claim 11.

19. The semiconductor device according to claim 11, wherein edge sides of the second electrode is inside the third depressed portion.

20. A semiconductor device comprising:
a thin film transistor formed over a substrate;
an insulating film positioned over the thin film transistor; and
a light-emitting element which is formed over the insulating film and of which light emission is controlled by the thin film transistor,
wherein the light-emitting element includes:
  a first depressed portion or opening portion formed in the insulating film;
  a first electrode which is formed over the insulating film around the first depressed portion or opening portion, which is formed at a bottom surface and a side surface of the first depressed portion or opening portion, and which has a second depressed portion in the first depressed portion or opening portion;
  a semiconductor layer of a first conductivity type, which is formed over the first electrode and which has a third depressed portion in the second depressed portion;
  a light-emitting layer which is formed over the semiconductor layer of the first conductivity type and which has a fourth depressed portion in the third depressed portion;
  a semiconductor layer of a second conductivity type, which is formed over the light-emitting layer and which has a fifth depressed portion in the fourth depressed portion; and
  a second electrode formed over the semiconductor layer of the second conductivity type that has a bottom surface and a side surface of the fifth depressed portion.

21. The semiconductor device according to claim 20, wherein the thin film transistor includes an island-shaped ZnO film and an impurity region which is formed in the ZnO film and which becomes a source or a drain of the thin film transistor.

22. The semiconductor device according to claim 20, wherein the substrate is a flexible substrate or a plastic substrate.

23. An electronic appliance provided with the semiconductor device according to claim 20.

24. The semiconductor device according to claim 20, wherein edge sides of the second electrode is inside the third depressed portion.

25. A semiconductor device comprising:
a thin film transistor formed over a substrate;
an insulating film positioned over the thin film transistor; and
a light-emitting element which is formed over the insulating film and of which light emission is controlled by the thin film transistor,
wherein the light-emitting element includes:
  a first electrode which is formed at a bottom surface and a side surface of a first depressed portion or opening portion and which has a second depressed portion in the first depressed portion or opening portion;
  a semiconductor layer of a first conductivity type, which is formed over the first electrode and which has a third depressed portion in the second depressed portion;
  a light-emitting layer which is formed over the semiconductor layer of the first conductivity type and which has a fourth depressed portion in the third depressed portion;
  a semiconductor layer of a second conductivity type, which is formed over the light-emitting layer and which has a fifth depressed portion in the fourth depressed portion; and
  a second electrode formed over the semiconductor layer of the second conductivity type that has a bottom surface and a side surface of the fifth depressed portion,
wherein an end face of the light-emitting layer has an angle of more than 90° and less than 270° to a surface of the insulating film.

26. The semiconductor device according to claim 25, wherein the thin film transistor includes an island-shaped ZnO film and an impurity region which is formed in the ZnO film and which becomes a source or a drain of the thin film transistor.

27. The semiconductor device according to claim 25, wherein the substrate is a flexible substrate or a plastic substrate.

28. An electronic appliance provided with the semiconductor device according to claim 25.

29. The semiconductor device according to claim 25, wherein edge sides of the second electrode is inside the third depressed portion.

30. A display device comprising:
a thin film transistor formed over a substrate;
an insulating film positioned over the thin film transistor;
a light-emitting element which is formed over the insulating film, which emits ultraviolet light, and of which light emission is controlled by the thin film transistor; and
a fluorescent body which is positioned over the light-emitting element and which emits visible light by absorbing the ultraviolet light emitted from the light-emitting element, wherein light-emitting element includes:
  a first depressed portion or opening portion formed in the insulating film;
  a first electrode which is formed over the insulating film around the first depressed portion or opening portion and at a bottom surface and a side surface of the first depressed portion or opening portion and which has a second depressed portion in the first depressed portion or opening portion;
  a semiconductor layer of a first conductivity type, which is formed over the first electrode and which has a third depressed portion in the second depressed portion;
  a light-emitting layer which is formed over the semiconductor layer of the first conductivity type and which has a fourth depressed portion in the third depressed portion;
  a semiconductor layer of a second conductivity type, which is formed over the light-emitting layer and which has a fifth depressed portion in the fourth depressed portion; and
  a second electrode formed over the semiconductor layer of the second conductivity type that has a bottom surface and a side surface of the fifth depressed portion.

31. The display device according to claim 30,
wherein the thin film transistor includes an island-shaped ZnO film and an impurity region which is formed in the ZnO film and which becomes a source or a drain of the thin film transistor.

32. The display device according to claim 30,
wherein the substrate is a flexible substrate or a plastic substrate.

33. An electronic appliance provided with the display device according to claim 30.

34. The display device according to claim 30,
wherein edge sides of the second electrode is inside the third depressed portion.

35. A display device comprising:
a thin film transistor formed over a substrate;
an insulating film positioned over the thin film transistor;
a light-emitting element which is formed over the insulating film, which emits ultraviolet light, and of which light emission is controlled by the thin film transistor; and
a fluorescent body which is positioned over the light-emitting element and which emits visible light by absorbing the ultraviolet light emitted from the light-emitting element,
wherein the light-emitting element includes:
  a first depressed portion or opening portion formed in the insulating film;
  a first electrode which is formed at a bottom surface and a side surface of the first depressed portion or opening portion and which has a second depressed portion in the first depressed portion or opening portion;
  a semiconductor layer of a first conductivity type, which is formed over the first electrode and which has a third depressed portion in the second depressed portion;
  a light-emitting layer which is formed over the semiconductor layer of the first conductivity type and which has a fourth depressed portion in the third depressed portion;
  a semiconductor layer of a second conductivity type, which is formed over the light-emitting layer and which has a fifth depressed portion in the fourth depressed portion; and
  a second electrode formed over the semiconductor layer of the second conductivity type that has a bottom surface and a side surface of the fifth depressed portion,
wherein an end face of the light-emitting layer has an angle of more than 90° and less than 270° to a surface of the insulating film.

36. The display device according to claim 35,
wherein the thin film transistor includes an island-shaped ZnO film and an impurity region which is formed in the ZnO film and which becomes a source or a drain of the thin film transistor.

37. The display device according to claim 35,
wherein the substrate is a flexible substrate or a plastic substrate.

38. An electronic appliance provided with the display device according to claim 35.

39. The display device according to claim 35,
wherein edge sides of the second electrode is inside the third depressed portion.

40. A method for manufacturing a semiconductor device, comprising:
  forming a first depressed portion or opening portion in an insulating film;
  forming a first conductive film over the insulating film and at a bottom surface and a side surface of the first depressed portion or opening portion to form a second depressed portion in the first depressed portion or opening portion;
  forming a semiconductor layer of a first conductivity type over the first conductive film to form a third depressed portion in the second depressed portion;
  forming a light-emitting layer over the semiconductor layer of the first conductivity type to form a fourth depressed portion in the third depressed portion;
  forming a semiconductor layer of a second conductivity type over the light-emitting layer to form a fifth depressed portion in the fourth depressed portion;
  forming a second conductive film over the semiconductor layer of the second conductivity type; and
  selective etching to remove a part of the first and second conductive films, the semiconductor layer of the first conductivity type, the semiconductor layer of the second conductivity type, and the light-emitting layer, that is positioned over the insulating film.

41. A method for manufacturing a semiconductor device, comprising:
  forming a first depressed portion or opening portion in an insulating film;
  forming a first conductive film over the insulating film and at a bottom surface and a side surface of the first depressed portion or opening portion to form a second depressed portion in the first depressed portion or opening portion;
  forming a semiconductor layer of a first conductivity type over the first conductive film to form a third depressed portion in the second depressed portion;
  forming a light-emitting layer over the semiconductor layer of the first conductivity type to form a fourth depressed portion in the third depressed portion;
  forming a semiconductor layer of a second conductivity type over the light-emitting layer to form a fifth depressed portion in the fourth depressed portion;
  forming a second conductive film over the semiconductor layer of the second conductivity type; and
  polishing or etch-back to remove a part of the first and second conductive films, the semiconductor layer of the first conductivity type, the semiconductor layer of the second conductivity type, and the light-emitting layer, that is positioned over the insulating film.

42. A method for manufacturing a semiconductor device, comprising:
    forming a thin film transistor over a substrate;
    forming an insulating film over the thin film transistor;
    forming a first depressed portion in the insulating film and over the thin film transistor;
    forming a connection hole at a bottom surface of the first depressed portion and over a source or a drain of the thin film transistor;
    forming a first conductive film which is electrically connected to the source or the drain through the connection hole, over the insulating film and at the bottom surface and a side surface of the first depressed portion to form a second depressed portion in the first depressed portion;
    forming a semiconductor layer of a first conductivity type over the first conductive film to form a third depressed portion in the second depressed portion;
    forming a light-emitting layer over the semiconductor layer of the first conductivity type to form a fourth depressed portion in the third depressed portion;
    forming a semiconductor layer of a second conductivity type over the light-emitting layer to form a fifth depressed portion in the fourth depressed portion;
    forming a second conductive film over the semiconductor layer of the second conductivity type, and
    selective etching to remove a part of the first and second conductive films, the semiconductor layer of the first conductivity type, the semiconductor layer of the second conductivity type, and the light-emitting layer, that is positioned over the insulating film.

43. A manufacturing method of a semiconductor device, comprising:
    forming a thin film transistor over a substrate;
    forming an insulating film over the thin film transistor;
    forming a first depressed portion in the insulating film and over the thin film transistor;
    forming a connection hole at a bottom surface of the first depressed portion and over a source or a drain of the thin film transistor;
    forming a first conductive film which is electrically connected to the source or the drain through the connection hole, over the insulating film and at the bottom surface and a side surface of the first depressed portion to form a second depressed portion in the first depressed portion;
    forming a semiconductor layer of a first conductivity type over the first conductive film to form a third depressed portion in the second depressed portion;
    forming a light-emitting layer over the semiconductor layer of the first conductivity type to form a fourth depressed portion in the third depressed portion;
    forming a semiconductor layer of a second conductivity type over the light-emitting layer to form a fifth depressed portion in the fourth depressed portion;
    forming a second conductive film over the semiconductor layer of the second conductivity type, and
    polishing or etch-back to remove a part of the first and second conductive films, the semiconductor layer of the first conductivity type, the semiconductor layer of the second conductivity type, and the light-emitting layer, that is positioned over the insulating film.

* * * * *